US010682759B1

(12) United States Patent
Oelrich

(10) Patent No.: US 10,682,759 B1
(45) Date of Patent: Jun. 16, 2020

(54) HUMAN-ROBOT INTERACTION FUNCTION ALLOCATION ANALYSIS

(71) Applicant: The United States of America as represented by the Secretary of the Navy, Arlington, VA (US)

(72) Inventor: Rosemarie Yagoda Oelrich, Virginia Beach, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 127 days.

(21) Appl. No.: 13/662,137

(22) Filed: Oct. 26, 2012

(51) Int. Cl.
*B25J 9/16* (2006.01)
(52) U.S. Cl.
CPC .................... *B25J 9/1656* (2013.01)
(58) Field of Classification Search
CPC ........ G06Q 10/00; G06Q 40/00; G06Q 40/06; G06F 17/60
USPC ......................................................... 705/7.11
See application file for complete search history.

(56) References Cited

U.S. PATENT DOCUMENTS

| | | | | |
|---|---|---|---|---|
| 7,343,232 B2* | 3/2008 | Duggan | ............... | G05D 1/0061 244/75.1 |
| 8,108,192 B2 | 1/2012 | Ikegami et al. | | |
| 8,195,343 B2 | 6/2012 | Lin | | |
| 8,225,092 B2 | 8/2012 | Phillips et al. | | |
| 8,271,132 B2* | 9/2012 | Nielsen | .................... | B25J 9/161 318/568.17 |
| 8,326,469 B2 | 12/2012 | Phillips et al. | | |
| 8,396,611 B2 | 3/2013 | Phillips et al. | | |
| 8,447,440 B2 | 5/2013 | Phillips et al. | | |

(Continued)

OTHER PUBLICATIONS

Burke et al., "Task Performance Metrics in Human-Robot Interaction: Taking a Systems Approach", Performance Metrics for Intelligent Systems Workshop, Sep. 2004.*

(Continued)

*Primary Examiner* — Romain Jeanty
(74) *Attorney, Agent, or Firm* — Howard Kaiser

(57) ABSTRACT

Typical inventive practice allocates functions between human and robot, interacting in an unmanned system. Analyses are performed of: mission system; function allocation; and, human-robot interaction automation allocation. Mission system analysis includes: identification of mission system needs, mission system integration parameters, and mission capability configuration; and, mission system report creation (at least partially based on these identifications). Function allocation analysis includes: mission activity analysis; functional allocation report creation (at least partially based on the mission activity analysis); unmanned system safety analysis; and, unmanned system safety report creation (at least partially based on the unmanned system safety analysis). Human-robot interaction automation allocation analysis includes: identification of unmanned system capabilities, unmanned system mission safety considerations, and human-robot interaction configuration; human-robot interaction test-and-evaluation plan creation (at least partially based on these identifications); human-robot interaction performance evaluation; and, human-robot interaction configuration final report creation (at least partially based on the human-robot interaction performance evaluation).

14 Claims, 20 Drawing Sheets

(56) References Cited

U.S. PATENT DOCUMENTS

| | | | |
|---|---|---|---|
| 8,577,126 B2 | 11/2013 | Jones et al. | |
| 8,768,555 B2* | 7/2014 | Duggan | G05D 1/0061 244/75.1 |
| 8,843,244 B2 | 9/2014 | Phillips et al. | |
| 9,046,892 B2 | 6/2015 | Jang et al. | |
| 9,108,729 B2 | 8/2015 | Duggan et al. | |
| 2001/0054046 A1* | 12/2001 | Mikhailov et al. | 707/500 |
| 2005/0004723 A1* | 1/2005 | Duggan et al. | 701/24 |
| 2009/0180668 A1 | 7/2009 | Jones et al. | |
| 2009/0265137 A1* | 10/2009 | Iida et al. | 702/183 |
| 2011/0295399 A1 | 12/2011 | Plociennik et al. | |
| 2014/0163730 A1 | 6/2014 | Mian | |

OTHER PUBLICATIONS

Steinfeld at al., "Common Metrics for Human-Robot Interaction", HRI '06 Proceedings of the 1st ACM SIGCHI/SIGART Conference on Human-robot Interaction, Association for Computing Machinery, Mar. 2006.*

Ghosh et al., "A Systems Approach to Task Allocation of Human-Robot Interaction in Manufacturing", Journal of Manufacturing Systems, 1986, vol. 5/ No. 1, pp. 41-49.*

Le Ny (Performance optimization for unmanned vehicle systems), Dec. 2008, Massachusetts Institute of Technology. Dept. of Aeronautics and Astronautics (pp. 1-3) Emilio (Year: 2008).*

NextGen Unmanned Aircraft Systems (UAS) Research, Development and Demonstration Roadmap, Next Generation Air Transportation System, Joint Planning and Development Office, Version 1.0, Mar. 15, 2012 (80 pages).

Rosemarie E. Yagoda and Susan G. Hill, "Using Mobile Devices for Robotic Controllers: Examples and Some Initial Concepts for Experimentation," ARL-TN-436, Army Research Laboratory, Jun. 2011 (40 pages).

Rosemarie E. Yagoda, "You Want Me to Use That Robot? Identifying Underlying Factors Affecting Robot Use," under the direction of Dr. Douglas Gillan, a dissertation submitted to the Graduate Faculty of North Carolina State University in partial fulfillment of the requirements for the degree of Doctor of Philosophy, Psychology, Raleigh, North Carolina, 2013 (56 pages).

Douglas L. Gillan, Jennifer M. Riley, Patricia L. McDermott, Haydee M. Cuevas, Rosemarie E. Yagoda, Roger A. Chadwick, Skye Lee Pazuchanics, and M. D. Aberdeen, "Human-Robot Interaction Interface Design Guidelines for Unmanned Vehicle Tasking and Control," Sponsored by U.S. Army Research Laboratory, Advanced Decision Architectures Collaborative Technology Alliance, FY10 Technical Area #3 Joint Research Task 10TA3-SP2-RT1, Cooperative Agreement DAAD19-01-2-0009, 2009 (63 pages).

\* cited by examiner

| Configuration Domain | Description |
|---|---|
| Level of Control | Locus at which a controlling entity interacts, influences, or directs a UMS(s).<br>• Actuator<br>• Primitive<br>• Subsystem<br>• Vehicle<br>• Group of vehicles<br>• System of systems |
| Level of Authority | The degree to which an entity is invested with the power to access the control and functions of a UMS.<br>• Reception and transmission of secondary imagery or data.<br>• Reception of imagery or data directly from the UMS.<br>• Control of the UMS payload.<br>• Full control of the UMS excluding deployment and recovery.<br>• Full control of the UMS including deployment and recovery. |
| Level of Autonomy | The level of ability of the unmanned system to sense, perceive, analyze, communicate, plan, make decisions, and act/execute a capability function to achieve an objective.<br>• Level V: Autonomous.<br>• Level IV: Human Aided.<br>• Level III: Human Directed.<br>• Level II: Tele-operation.<br>• Level I: Remote Control. |
| Method of Control | The interface, either software or hardware, such as a joystick, waypoint selection via a map interface, natural language, hand signals, etc., that operators use to control a UMS. |

- Safety, consistent with USV requirements, should be designed into the USV architecture in an appropriate and timely manner.
  - Design to minimize risk created by system error in USV operations.
    - Integrate into USV health monitoring module design.
  - Design to minimize risk created by human error in unmanned system operations.
    - Provide USV health monitoring module.
- Hazards within the USV architecture are identified, documented, tracked, evaluated, and eliminated, or their associated risk is mitigated to an acceptable level.
- Actions taken to eliminate hazards within the USV architecture to mitigate risk to an acceptable level are documented.
  - Locate and isolate hazardous USV elements and operations. Hazards should not affect other USV elements and operations.
- USV architecture fail-safe design minimizes the initiation of hazardous events or mishaps.
  - Integrates hazardous elements that cannot be eliminated.
- Minimize the severity of injury or damage in the event of a mishap to the mission system, USV, military and civilian personnel.
- Changes in the USV architecture, HRI, overall mission system, or mission requirements are documented and risk remains at an acceptable level.
- Historical USV safety data, including lessons learned from other unmanned systems, are considered.
- Minimum risk consistent with the needs of the mission system is sought when utilizing new technology USVs technology.
  - Minimize risk to the USV resulting from excessive environmental conditions.
- Actions should be taken to eliminate the use of hazardous materials (HM) associated with the unmanned mission system; if used, risk should be mitigated to an acceptable level.

FIG. 9

| | |
|---|---|
| PHA | Preliminary Hazard Analysis (PHA) should be performed in accordance with MIL-STD-882. |
| SRCA | Safety Requirements Criteria Analysis (SRCA) should be performed in accordance with MIL-STD-882. |
| O&SHA | Operating and Support Hazard Analysis (O&SHA) should be performed in accordance with MIL-STD-882. |
| HHA | Health Hazard Assessment (HHA) should be performed in accordance with MIL-STD-882. |
| FMECA | Failure mode, effects, and criticality analysis (FMECA) should be performed in accordance with MIL-STD-1629. |

FIG. 10

| REPORT | PURPOSE | APPLICATION | CONTENT |
|---|---|---|---|
| Mission System (MS) Report | Provide a synopsis of the objectives that satisfy the needs of the MS. This report documents the specific functional capabilities and logistical elements required in accomplishing the unmanned mission system objectives. | The report identifies the initial MS performance and non-performance requirements. This document should be generated prior to new USV development, modification, or re-engineering. | The MS Report should include the following:<br>a. Detailed description of MS objectives with associated performance and non-performance requirements<br>b. LSA<br>c. MS task decomposition within each operational and non-operational state<br>d. Detailed description of MS capabilities with associated performance and non-performance requirements<br>e. Detailed documentation of USV platform configuration |
| Functional Allocation (FA) Report | Provide functional decomposition of the USV within each operational and non-operational state. This report is a comprehensive description of the USV architecture based on the results of analyses conducted. | The report documents the functional performance requirements of the USV. This document should be generated prior to developing the USS plan. This document provides the foundation for the USS analysis. | The FA Report should include the following:<br>a. Detailed hierarchical documentation of the tasks, actions, and activities required within each mode of operation<br>b. Functional decomposition of required equipment operations and functional element interactions within each task<br>c. Detailed description of the functional performance requirements<br>d. Detailed documentation of the required human interactions within each task<br>e. Detailed description of MS capabilities within each operational and non-operational state of the modes of operation<br>f. Detailed description of MS limitations within each operational and non-operational state of the modes of operation<br>g. Identification of human capabilities and limitations within each operational and non-operational state of the modes of operation<br>h. Provide overall USV architecture |
| Unmanned System Safety (USS) Report | Provide USS plan. This report is a comprehensive description of USS considerations identified based on the results of analyses conducted. | The report documents USS considerations that should be integrated throughout new unmanned system development, modification, or re-engineering. This document should be generated prior to identifying the HRI configurations. | The USS Report should include the following:<br>a. Detailed documentation of the general safety and risk assessments<br>b. Detailed verification documentation of the required USS precepts<br>c. Detailed documentation of the USV architecture hazard analysis<br>d. Detailed documentation of the USS plan<br>e. Detailed description of the integration approach of the USS plan |

FIG. 11

| REPORT | PURPOSE | APPLICATION | CONTENT |
|---|---|---|---|
| HRI Performance Test and Evaluation (T&E) Plan | Provide a roadmap of the USV test program. This document includes general planning factors, objectives, and scope and detail of test activities within the test program. In defining specific test objectives, data priorities, support, resource and configuration requirements, it is used to evaluate the proposed test program/procedures. | The report documents the verification process of the performance and non-performance requirements established throughout the HRI-FAA process. This document should be generated prior to HRI performance evaluation. The test report documentation should be formatted utilizing MIL-HDBK-831. | The test plan and procedures should include the following:<br>a. Prioritized test objectives with descriptions and identified performance criteria<br>b. Identification of test item configuration<br>c. Applicable performance data predictions<br>d. Detailed test schedule and integrated procedural information<br>e. System test requirements verification matrix<br>f. Data processing and reporting procedures<br>g. USS Plan and additional testing safety measures utilized<br>h. Technical and logistical support requirements<br>i. Test information sheets |
| HRI Configuration Final Report | Provide a synopsis of the HRI-FAA process conducted. This report is a comprehensive description of the USV configurations established based on the analyses conducted throughout the HRI-FAA. This report is used to verify and validate each HRI configuration. | This final report documents HRI-FAA process throughout new USV development, modification, or re-engineering. This document should be generated after the HRI performance evaluation is conducted. | The HRI Configuration Final Report should document the following:<br>a. Provide all HRI performance evaluation test reports<br>b. Verification that mission system objectives have been met<br>c. Verification of logistical support requirements have been met<br>d. Verification of MS performance and non-performance requirements have been met without exceeding system capabilities<br>e. Verification of functional performance requirements have been met<br>f. Verification of human performance and non-performance requirements have been met without exceeding human capabilities<br>g. Verification of the HRI configurations in terms of safe and effective mission operations |

FIG. 12

HUMAN-ROBOT INTERACTION FUNCTION ALLOCATION ANALYSIS

BACKGROUND OF THE INVENTION

The present invention relates to interactive relationships between humans and robots, more particularly to methods and systems for configuring the allocation of functions between humans and robots in their interactions.

Unmanned systems represent an important realm of military technology. A conventional unmanned system includes a robotic platform, at least one payload, an operator control unit (OCU), logistical support, and at least one person. Examples of unmanned systems are unmanned ground vehicle (UGV), unmanned aerial vehicle (UAV), unmanned surface vehicle (USV), and unmanned underwater vehicle (UUV). Examples of payloads are sensors, communications relay, and cargo. An operator control unit can include, for instance, command and control (C2), visual displays, mission planning capabilities, system monitoring functions, and communication channels. Logistical support can include, for instance, manning, transporting, maintaining, launch and recovery, and enabling communication architecture. Yet the most critical element for successful unmanned system employment is the human component.

A typical unmanned system evolves and matures, increasing in both capability and complexity, in order to keep up with operational demands of missions. In the term "unmanned system," the word "unmanned" is a misnomer in the sense that a person or persons are not necessarily uninvolved in an unmanned system. A traditional unmanned system is in fact "manned" through direct and constant oversight and control, albeit the robotic platforms itself is not manned. Therefore, in the development, configuration, and deployment of an unmanned system, all system elements should be taken into consideration in order to support and meet the needs of the warfighter. See "Unmanned Systems Integrated Roadmap 2009-2034," Office of Secretary of Defense, 6 Apr. 2009.

The proliferation of unmanned systems on the battlefield can afford significant operational and tactical advantages, particularly under uncertain and complex conditions; nevertheless, the associated technological implications are also significant and may be either productive or counterproductive. The integration of current technology can enable single robotic platforms to perform a variety of tasks across multiple missions; however, if the unmanned system is not configured properly, overall mission safety and effectiveness may be compromised or jeopardized.

It appears likely that, in the future, manned operations will be considerably enhanced and perhaps even revolutionized by unmanned systems technologies. This vision combines the inherent strengths of the warfighter with robotic assets, sensors, and manned/unmanned vehicles to achieve enhanced situational awareness (SA), reduced workloads, greater lethality, improved survivability, and sustainment. See "Eyes of the Army Roadmap for Unmanned Aircraft Systems 2010-2035," U.S. Army, available on the DTIC website.

Accordingly, there is a need for a systematic approach to determining appropriate levels of autonomy in unmanned systems. Of great benefit would be a process designed to guide the development, configuration, and implementation of human-robot systems.

SUMMARY OF THE INVENTION

In view of the foregoing, it is an object of the present invention to provide an improved methodology for allocating functions between human beings and robotic platforms in unmanned systems.

The present invention provides method, apparatus, and computer program product for allocating functions between human and robot within the human-robot interaction configuration of an unmanned system. A typical method for practicing the present invention is computer-implemented, and likewise, a typical apparatus for practicing the present invention includes a computer.

According to typical practice of the present invention, functions are allocated between human and robot in the human-robot interaction of an unmanned system. First, a mission system is analyzed. Second, function allocation is analyzed. Third, human-robot interaction automation allocation is analyzed.

The analysis of the mission system includes: (i) identifying the needs of the mission system; (ii) identifying the parameters of mission system integration; (iii) identifying the configuration of mission capability; and, (iv) creating a mission system report based at least in part on the identification of the needs of the mission system, the identification of the parameters of mission system integration, and the identification of the configuration of mission capability.

The analysis of function allocation includes: (i) analyzing mission activity; (ii) creating a functional allocation report based at least in part on the analysis of mission activity; (iii) analyzing unmanned system safety; and, (iv) creating an unmanned system safety report based at least in part on the analysis of unmanned system safety; and The analysis of human-robot interaction automation allocation includes: (i) identifying unmanned system capabilities; (ii) identifying unmanned system mission safety considerations; (iii) identifying human-robot interaction configuration; (iv) creating a human-robot interaction test and evaluation plan based at least in part on the identification of unmanned system capabilities, the identification of unmanned system mission safety considerations, and the identification of human-robot interaction configuration; (v) conducting a performance evaluation of human-robot interaction; and, (vi) creating a human-robot interaction configuration final report based at least in part on the human-robot interaction performance evaluation.

Typically, the inventive three-step process is progressive and cumulative in nature, each report drawing from and building upon the preceding report or reports. The functional allocation report is created based in part on the mission system report. The unmanned system safety report is created based in part on the mission system report and the functional allocation report. The human-robot interaction test and evaluation plan is created based in part on the mission system report, the functional allocation report, and the unmanned system safety report. The human-robot interaction configuration final report is created based in part on the mission system report, the functional allocation report, the unmanned system safety report, and the human-robot interaction test and evaluation plan.

The inventive methodology typically is computer-implemented. The analysis of the mission system, the analysis of function allocation, and the analysis of human-robot interaction automation allocation are each performed using a computer. The computer accepts inputting of data pertaining to the analysis of the mission system, the analysis of function allocation, and the analysis of human-robot interaction automation allocation. The computer is used to generate the mission system report, the functional allocation report, the unmanned system safety report, the human-robot interaction test and evaluation plan, and the human-robot interaction configuration final report.

Typical inventive practice involves actual effectuation (e.g., testing or implementation) of one or more embodiments of an unmanned system. That is, at least some of the data that the practitioner inputs into a computer is or has been empirically obtained by the practitioner, derived from observation or experiment with regard to one or more unmanned systems being investigated. For instance, when the robotic platform is an unmanned surface vehicle (USV), the USV may be variously embodied and deployed for testing and evaluative purposes, with the practitioner collecting various kinds of data with respect to the USV deployments.

As used herein, the term "human-robot interaction" (HRI) denotes the goal -oriented interaction between one or more humans and one or more robots to accomplish a task or set of tasks. HRI takes into account the entire human-robot system, as opposed to just the individual system components. Effective HRI assures that the unmanned system capabilities are appropriately allocated between human and robot to mitigate risk, while supporting and maintaining safe operations in all environmental conditions, as deemed necessary, without inducing negative effects on the system. The terms "unmanned system" and "human-robot system" are used interchangeably herein.

The present inventor styles her inventive methodology "Human-Robot Interaction Function Allocation Analysis," having the acronym "HRI-FAA." The main objectives of typical inventive practice are to: enhance situational awareness (SA); reduce physical, cognitive, and temporal workload; improve mission performance; and, minimize overall risk to both civilian and military personnel. Inventive practice provides guidance for incorporating HRI into development, sustainment, and acquisition of unmanned systems.

As typically embodied, the present invention's Human-Robot Interaction Function Allocation Analysis (HRI-FAA) is a novel three-step process that incorporates known analytical techniques so as to determine the appropriate level of autonomy that facilitates effective human-robot interactions (HRI) during all modes of operation. A typical embodiment of an inventive HRI-FAA is aimed at providing guidance throughout the development, systems engineering, integration, acquisition, testing, fielding, sustainment, and improvement of one or more unmanned systems. The inventive process serves toward developing, configuring, and safely employing unmanned systems.

Deliverables generated throughout the inventive process are used to evaluate and optimize HRI configurations and maximize unmanned system capabilities, while accounting for overall limitations. Inventive practice has the potential to serve a variety of audiences within all three environmental domains, viz., air, ground, and maritime. The reports generated throughout the HRI-FAA process are used to evaluate and optimize HRI configurations, thereby maximizing the effectiveness of robotic capabilities while accounting for overall limitations. The results are used to enhance situational awareness (SA), reduce physical, cognitive, and temporal workload, improve mission performance, and minimize overall risk to both civilian and military personnel.

Although the examples of inventive practice described herein are focused on the maritime environment, the ordinarily skilled artisan who reads the instant disclosure will appreciate that the present invention lends itself to multifarious applications. Some inventive embodiments are described herein by way of example in the marine realm of inventive practice, especially involving robotic platforms that are unmanned surface vehicles (USVs). Nevertheless, it is to be understood that inventive practice is possible with respect to various robotic platform categories, including but not limited to UGVs, UAVs, USVs, and UUVs. Inventive practice is applicable to diverse robotic platforms operating in diverse environments, whether air, land, water, or some combination thereof. The present invention admits of practice in a wide range of human-robot contexts. Based on the inventive teachings herein, many variations of inventive practice will be apparent to readers who are skilled in the pertinent arts.

Much of the instant disclosure describes how—in accordance with the present invention—to develop, configure, evaluate, and employ an unmanned system effectively across all modes of operation. Inventive practice seeks to guide the development, systems engineering, integration, acquisition, testing, fielding, sustainment, and improvement of unmanned systems. In human-robot interaction (HRI) applications, the present invention provides a methodology for developing, configuring, and safely employing human-robot systems. Effective HRI assures that functions and capabilities are appropriately allocated between human and robot to mitigate risk or risks, while supporting and maintaining safe operations in all environmental conditions, as deemed necessary, without inducing negative effects on the system.

Inventive practice is typically geared toward comportment with the policy requirements set forth in Section 941 of the John Warner National Defense Authorization Act for Fiscal Year (FY) 2007, associated with the research and development (R&D), test and evaluation (T&E), acquisition, and employment of unmanned systems. See Public Law log-364, 17 Oct. 2006. These U.S. policies are significant as they reflect a change in favor of unmanned over manned systems, and paradigm shifts on the battlefield may ensue. The present invention's HRI-FAA facilitates and supports this transitional effort.

Nevertheless, the present invention is sufficiently dynamic and flexible to permit modification of various elements of inventive practice while remaining true to the inventive principles. Inventive practice as described herein is directed primarily to assessment of mission modes of operation, and is adaptable over time to technological innovations and lessons learned.

BRIEF DESCRIPTION OF THE DRAWINGS

The present invention will now be described, by way of example, with reference to the accompanying drawings, wherein:

FIG. 7 is a table setting forth descriptions of configuration domains of an HRI Configuration Process in accordance with typical practice of the present invention.

Figure 8:
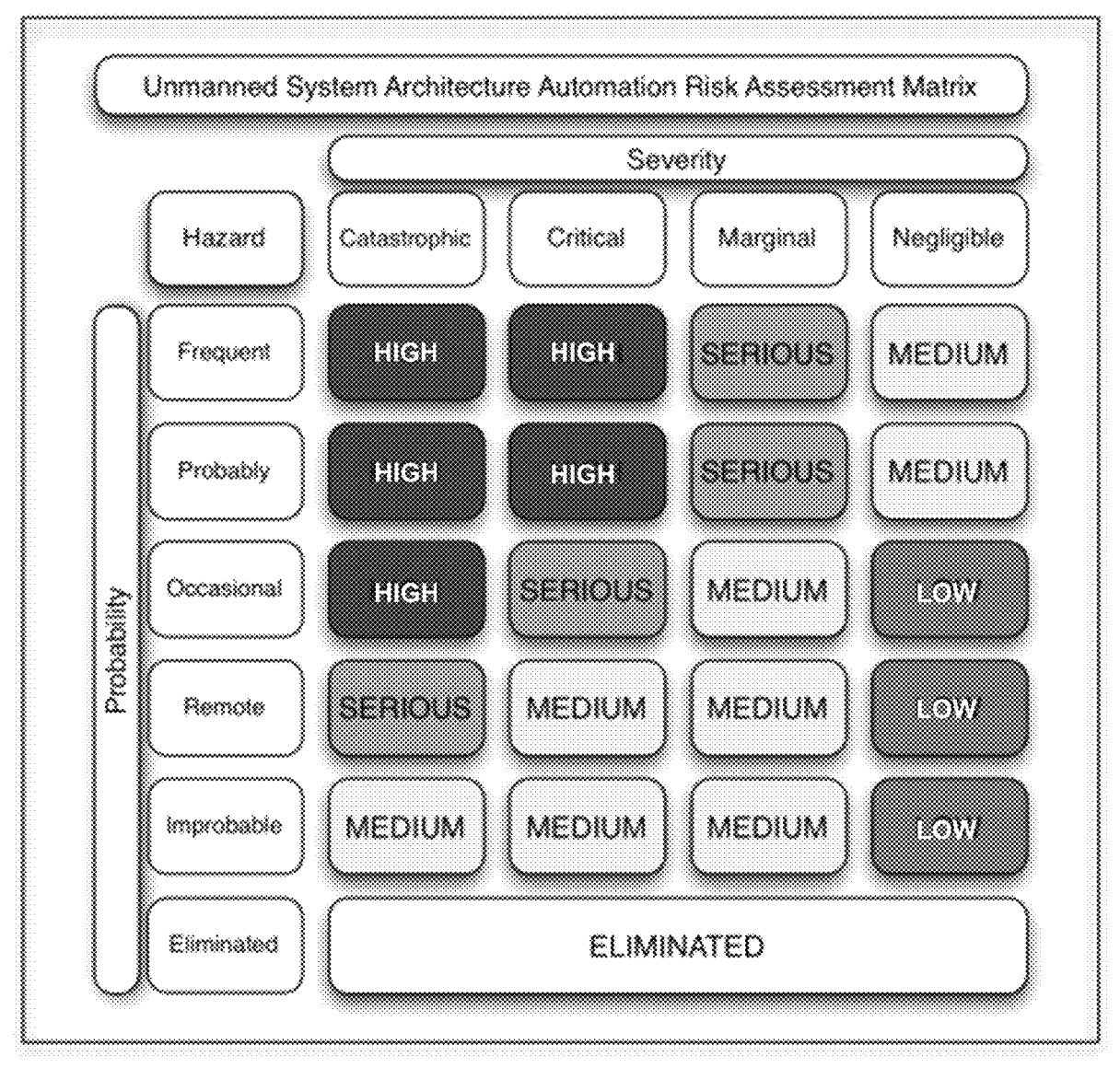

FIG. 8 is a diagram illustrating an example of an Unmanned System Architecture Automation Risk Assessment Matrix (RAM) in accordance with typical embodiments of the present invention.

FIG. 9 is a table setting forth general USS safety requirements for a USV in accordance with typical practice of the present invention.

FIG. 10 is a table setting forth standards for conducting a USS analysis in a General Safety and Risk Assessment in accordance with typical practice of the present invention.

FIGS. 11 and 12 are tabular representations, together constituting a table setting forth various reports that are rendered in accordance with typical practice of the present invention.

DESCRIPTION OF EXEMPLARY
EMBODIMENTS OF THE INVENTION

Referring now to the figures, the HRI-FAA is typically embodied as a three-step process to develop and configure unmanned systems. The terms "step, "phase," and "stage" are used synonymously herein to describe the three main sequential components of a typical inventive process. "Step One" identifies the mission-based unmanned system requirements necessary to maintain and support capability needs of both the mission and the warfighter. "Step Two" functionally decomposes the allocation of unmanned system capabilities within each mode of operation, and then conducts a comprehensive unmanned system safety analysis. "Step Three" evaluates the automation allocation of unmanned system capabilities in order to optimize HRI configurations within each mode of operation.

Step One: Mission System Analysis

Figure 1:
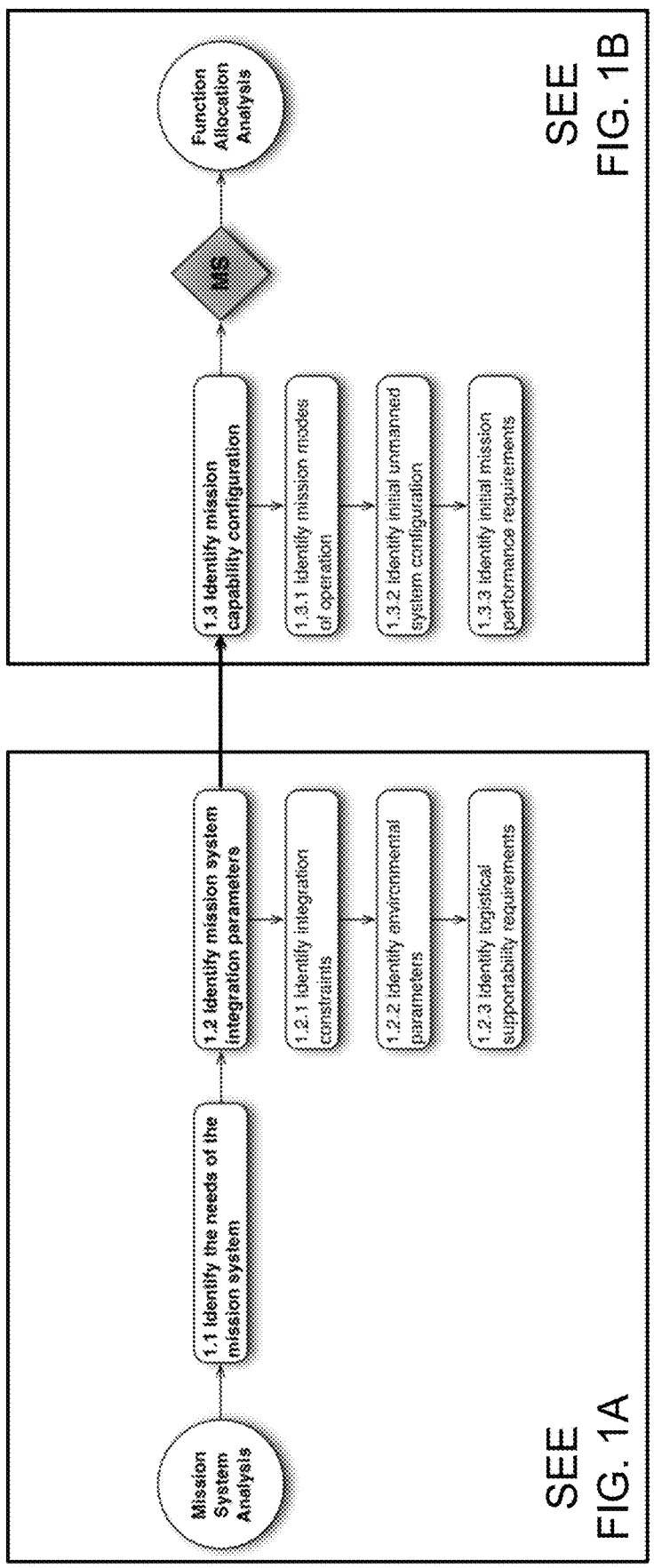
FIG. 1 is a flow diagram illustrating an overview of Mission System Analysis in accordance with typical practice of the present invention.

The overall needs of the mission system are identified in Step One, to determine the initial goals and performance objectives. The feasibility of employment is assessed to facilitate effective unmanned system integration in terms of potential constraints, overall environmental considerations, transportation, training, specific mission requirements, maintenance, and storage. Step One identifies the mission-based unmanned system requirements necessary to maintain and support capability needs of both the mission and the warfighter. An overview of Step One is provided herein in FIGS. 1, 1A, and 1B.

1.1 Identify Unmanned Mission System Needs

To synchronize the development and employment of an unmanned system, the mission system configurations need to address the capabilities required to achieve the established performance objectives. The unmanned mission system needs identified should also to take into account the prioritized needs of the warfighter within four main enabling capability portfolios, viz.: battlespace awareness; command and control; logistics; and, net-centric. See "Unmanned Systems Integrated Roadmap 2009-2034," Office of Secretary of Defense, 6 Apr. 2009.

1.2 Identify Unmanned Mission System Integration Parameters

Figure 1A:
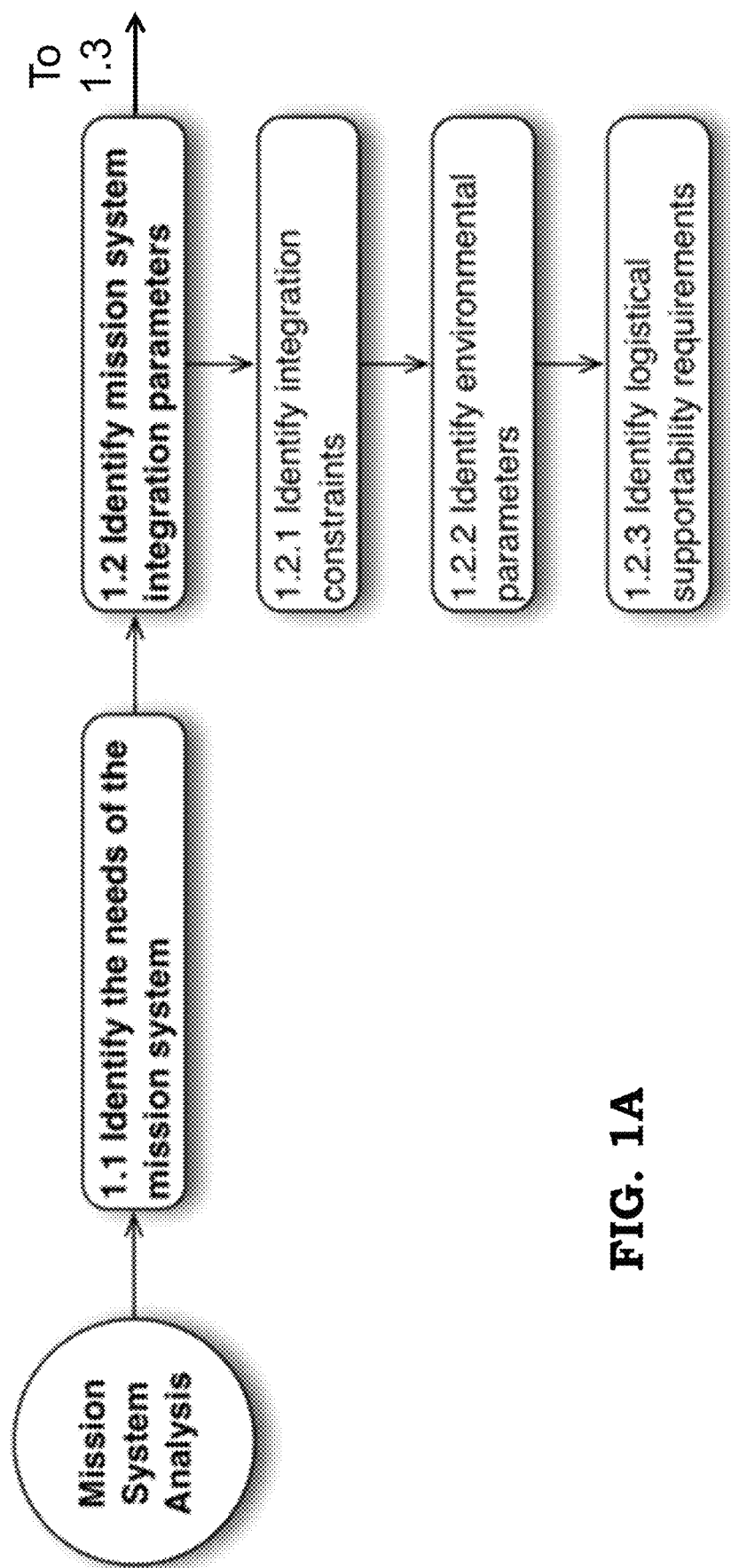
FIGS. 1A and 1B are enlarged portions of FIG. 1, together representing the entire FIG. 1.
Figure 1B:
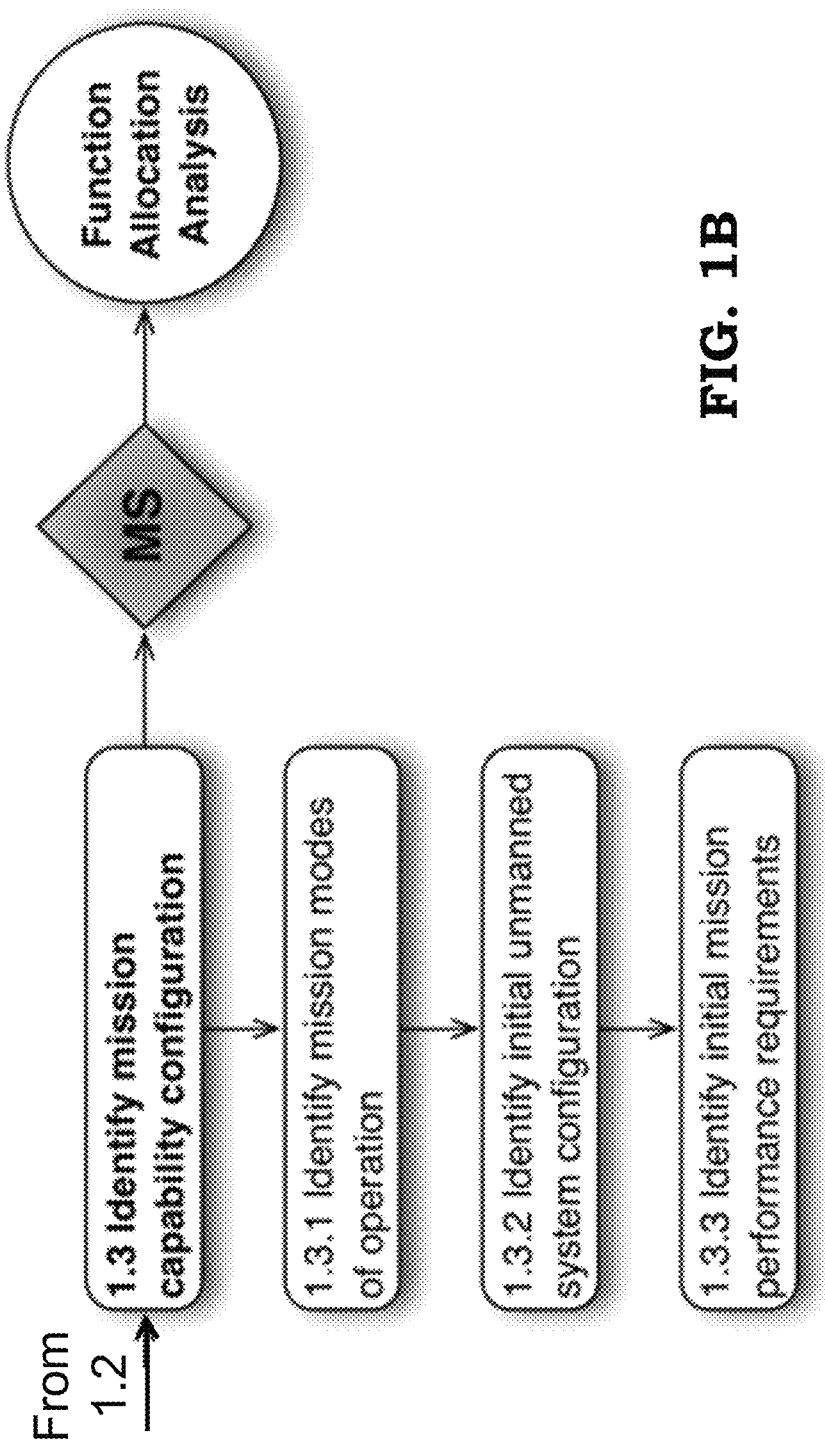
Figure 2:
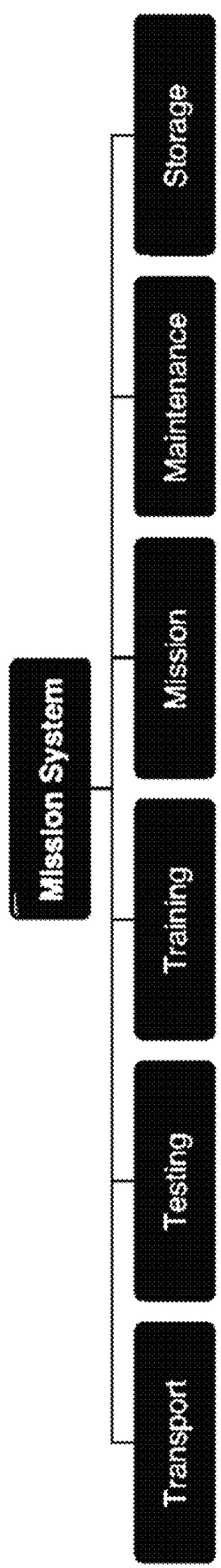
FIG. 2 is a schematic illustrating an overview of the components of an Unmanned Mission System in accordance with typical practice of the present invention.

The feasibility of employment should be first assessed to facilitate the likelihood of effective integration. Therefore, potential integration constraints and the environmental parameters should be identified prior to development or modification of an unmanned system (FIG. 1A, boxes 1.2.1 and 1.2.2). Design considerations should be identified for configuring the overall unmanned mission system, as noted in FIG. 2. More specifically, the preliminary design, or redesign, should address the integration parameters that have been identified.

A Logistical Support Analysis (LSA) should be conducted throughout the Reliability-Centered Maintenance (RCM) process. During the iterative unmanned system design cycles potential risks should be mitigated in order to enhance the supportability of unmanned system employment. A LSA is conducted on an iterative basis using the tasks identified in MIL-STD-1388-1, and should be formatted in accordance with MIL-STD-1388-2. See MIL-STD-1388-1, Logistical Support Analysis, 11 Apr. 1983; MIL-STD-1388-2, DoD Requirements for a Logistical Support Analysis Record, 28 Mar. 1991. The selection of tasks should be initially tailored towards identifying the integration constraints of the unmanned mission system. Later iterations should address enhancing the mission performance capabilities. Refer to MIL-STD-3034 for additional guidance regarding the RCM process. See MIL-STD-3034, DoD Standard Practice for Reliability-Centered Maintenance (RCM) Process, 21 Jan. 2011.

1.3 Identify USV Mission Capability Configurations

Figure 3:
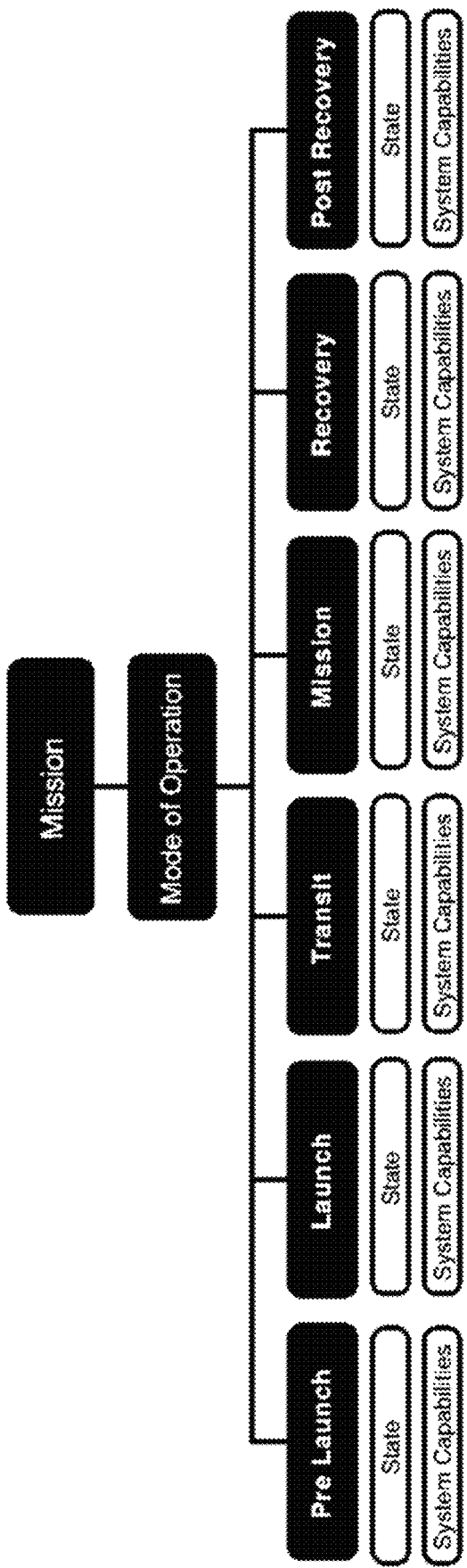
FIG. 3 is a schematic illustrating an overview of the modes of operation of an Unmanned Mission System in accordance with typical practice of the present invention.

The goals and objectives that should be achieved during a mission should be identified and then decomposed in terms of the mode of operation. The modes of operation are designated in FIG. 3 as "Pre-Launch," "Launch," "Transit," "Mission," "Recovery," and "Post-Recovery." Based on this goal decomposition, initial unmanned system mission capabilities should be identified. The limitations of the unmanned system mission capabilities should be assessed based on the mode of operation states, and configured accordingly. In terms of the capability configuration assessment, states refer to the current operational status (i.e., line of sight, beyond line of sight, loss of control, etc.), operational condition (i.e., normal operations, emergency operations, failure mode, etc.), and environmental condition (i.e., normal, degraded, etc.) within each mission mode of operation. Mission modes of operation are represented in FIG. 3 beneath the modes of operation. The designations in FIG. 3 for modes of operation and mission modes of operation are intended herein to be general terms.

Within the present invention's HRI-FAA process, unmanned system configurations are as follows: (i) robotic platform configuration that supports the mission capabilities; (ii) payload that supports the purpose of the mission capabilities (e.g., sensors, communications relay, cargo); (iii) OCU configuration (hardware and software) that supports the mission capabilities—Command, Control, Communications, and Computers (C4); and, (iv) logistical human configuration requirements (e.g., manning requirements, training considerations, multi-vehicle operational considerations, etc.).

The purpose of each mission capability is to facilitate mission effectiveness and to support the needs of the warfighter. Based on the overall capability needs of the mission, achievable and verifiable unmanned system performance requirements should be established. Performance requirements should be constructed using the guidance provided in MIL-HDBK-520 and MIL-STD-961. See MIL-HDBK-520, Systems Requirements Document Guidance, 5 Mar. 2010; MIL-STD-961, Defense and Program-Unique Specifications Format and Content, 2 Apr. 2008. These performance requirements should also document the approaches and methods for analysis of the unmanned system: (i) utilization environments; (ii) inherent human limitations and capabilities; (iii) performance expectations; and, (iv) design constraints and identification of needs, requirements, and constraints related to life cycle processes. All unmanned system capabilities identified to satisfy the mission performance requirements should be in accordance with the current U.S. DoD policies, statutory laws, and safety precepts.

Step Two: Function Allocation Analysis

Figure 4:
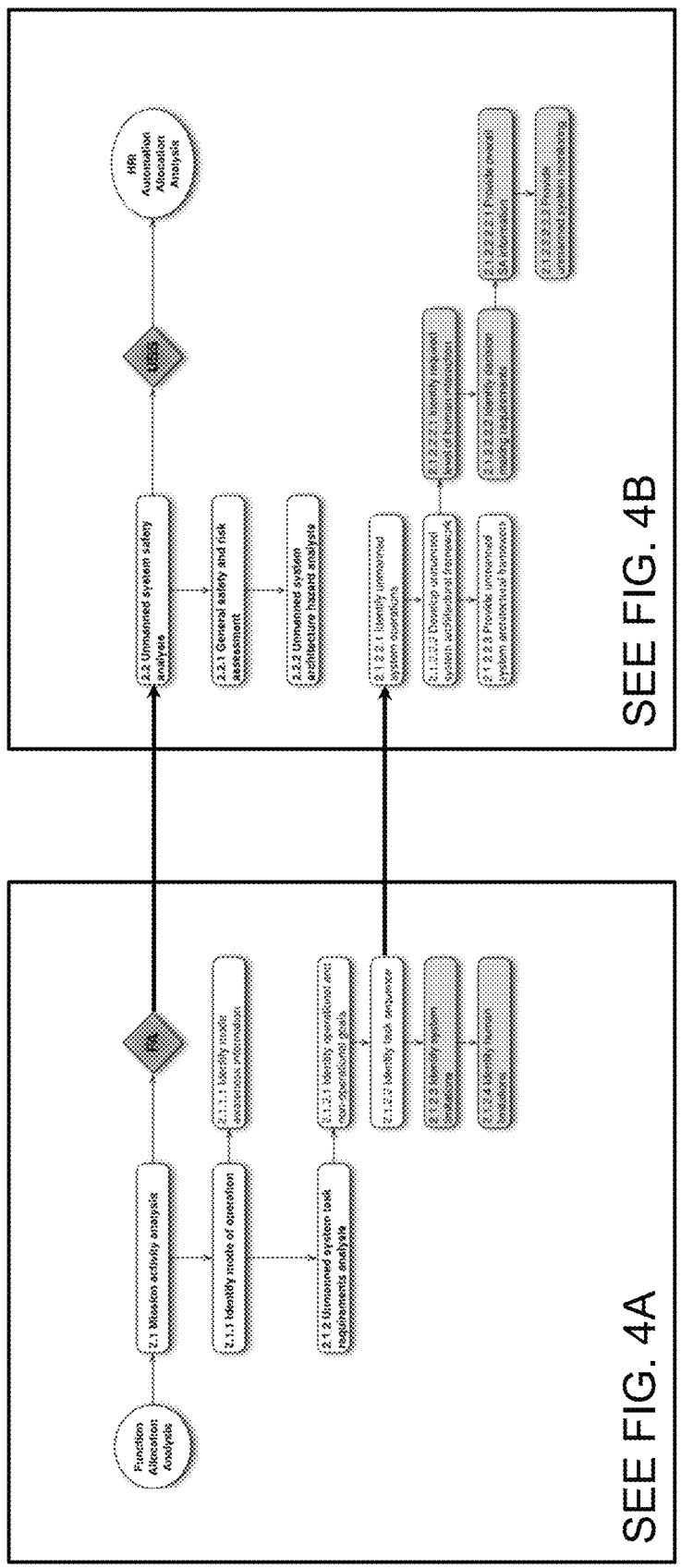
FIG. 4 is a flow diagram illustrating an overview of a Function Allocation Analysis in accordance with typical practice of the present invention.
Figure 4A:
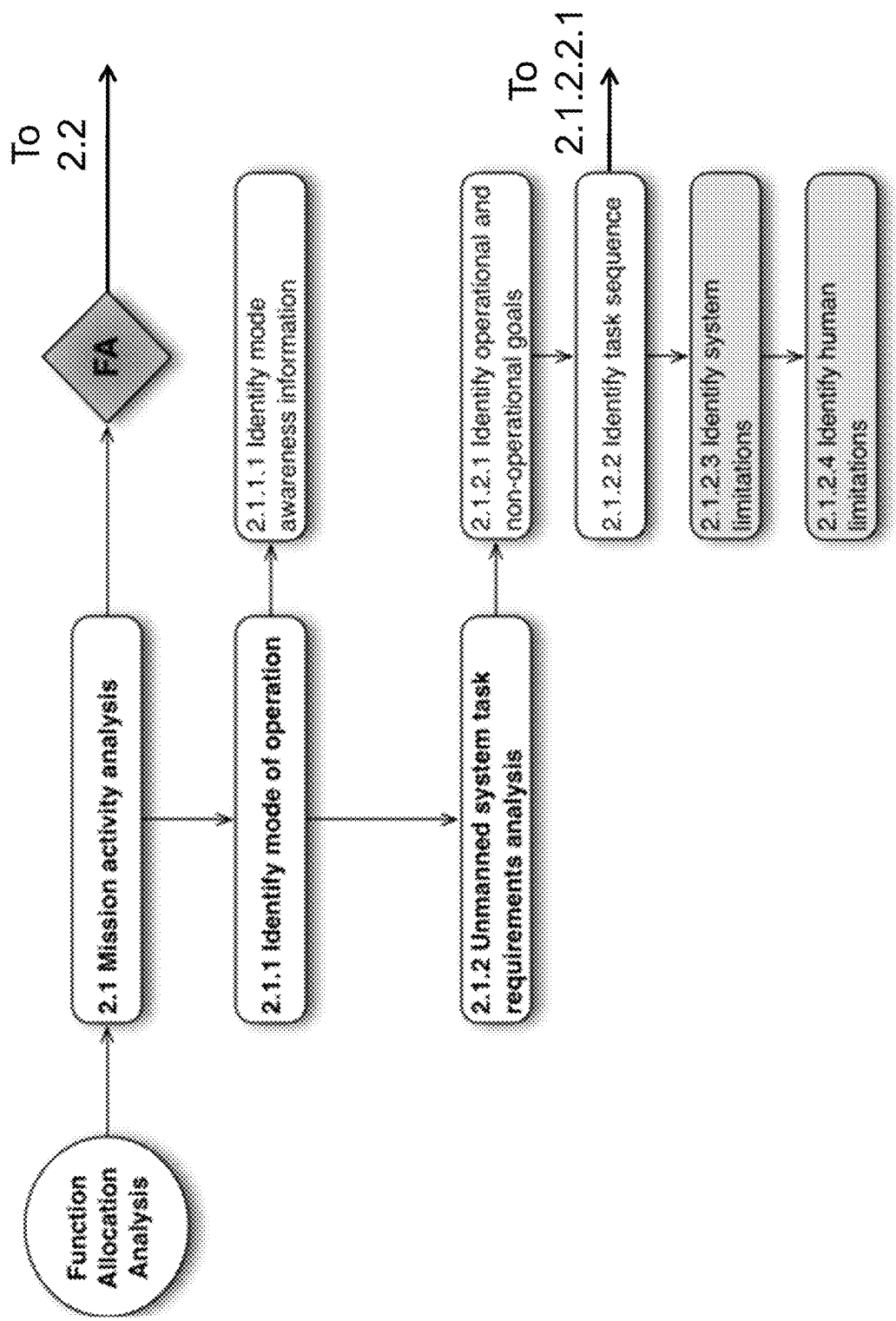
FIGS. 4A and 4B are enlarged portions of FIG. 4, together representing the entire FIG. 4.
Figure 4B:
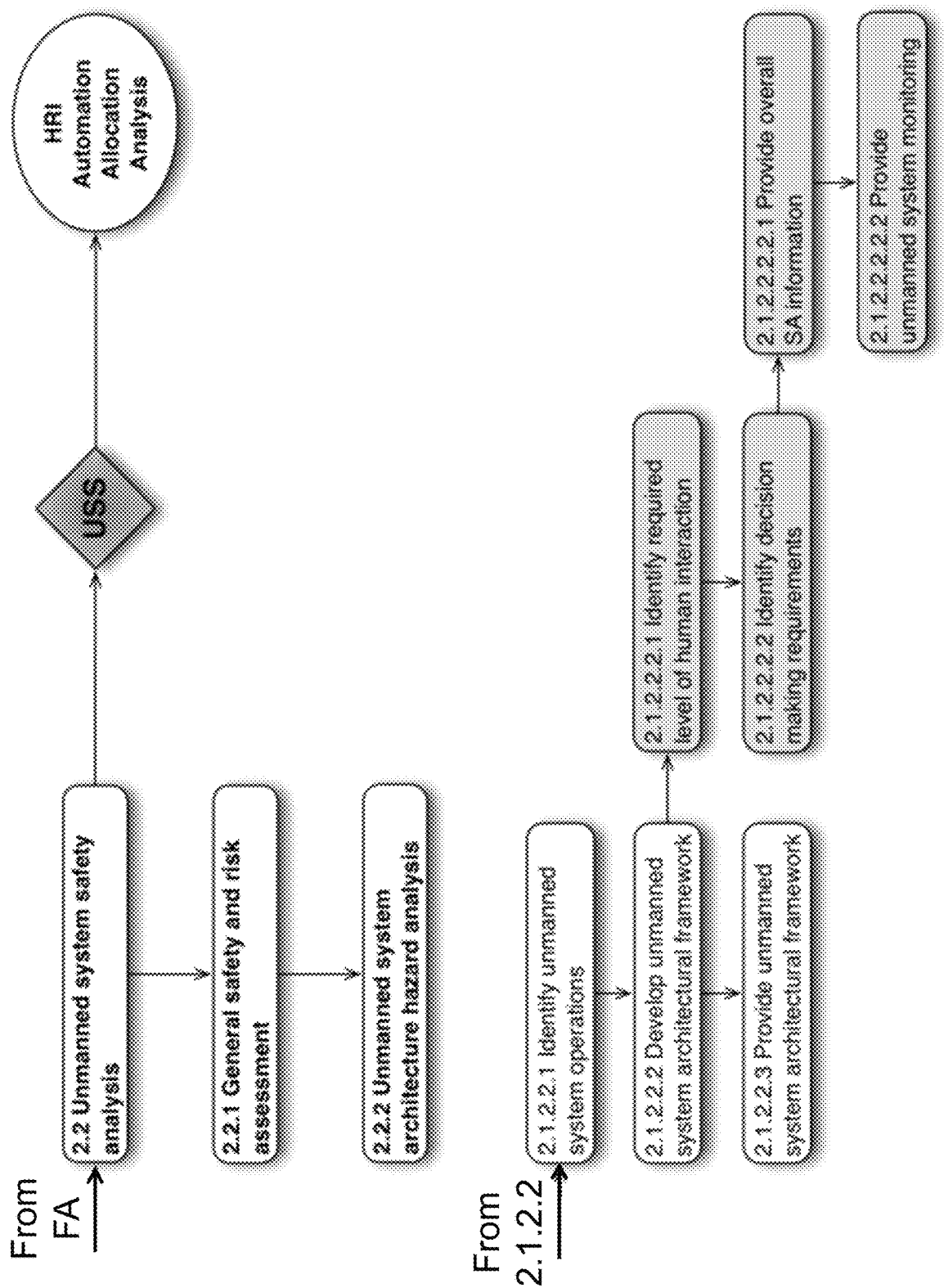

Step Two functionally decomposes the allocation of the unmanned system capabilities within each mode of operation. A comprehensive Unmanned System Safety Analysis should also be conducted. An overview of Step Two is provided herein in FIGS. 4, 4A, and 4B.

2.1 USV Mission Activity Analysis

Figure 5:
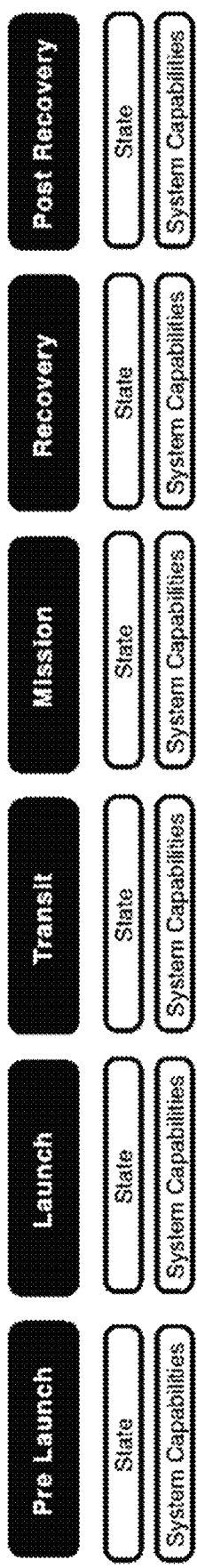
FIG. 5 is a schematic illustrating an overview of the capabilities within a Mission Mode of Operation State in accordance with typical practice of the present invention.

The unmanned system mission capability configurations identified should be decomposed in terms of the operational and non-operational modes of operation states (such as illustrated in FIG. 5). Mode awareness information should be derived from the following: (i) current statuses of the unmanned system capabilities available within the current mode of operation state; and, (ii) relevant notifications (or warnings, if applicable), which should promptly be provided when there has been a transition between states within a mode of operation.

Top-level functions are first identified within the state of each mode of operation by conducting requirements analysis, and then subdivided by conducting a functional analysis. Functions are identified and decomposed in terms of tasks, actions, and activities that should be performed in order to achieve operational and non -operational goals. These functions are further analyzed to determine unmanned system equipment operations within each task in terms of input, output, and equipment monitoring requirements.

The hierarchical breakdown of equipment operations is the foundation for generating the unmanned system architecture. This architecture should be developed and documented in accordance with IEEE/EIA Std 12207. See IEEE/EIA Std 12207, Software Life Cycle Processes, March 1998. The organizational structure of the unmanned system architecture defines the components, their interfaces, functional interactions, and system-based limitations.

Tools to consider when conducting a functional analysis include: (i) functional flow block diagrams that define the task sequences and relationships; (ii) timeline analyses that define the time sequence of critical functions; and, (iii) requirement allocation sheets that identify allocated performance and establish traceability of the performance requirements. See Systems Engineering Fundamentals: Functional Analysis and Allocation, available on the website of the Acquisition Community Connection, Defense Acquisition University.

In order to properly document the entire unmanned system architecture, the level and type of required human interaction should also be identified. Thus, all equipment functions that require any element of human interaction should be further classified to define the specific actions necessary to maintain functionality. Actions include, but are not limited to: manipulating; initiating action; disabling action; monitoring; checking; verifying; selecting; retrieving; communicating; providing feedback; and, maintaining.

Additional important considerations include: (i) interrelationships among functional elements; (ii) defining the types and criticality of information requirements/flows; (iii) the frequency of exchanges; (iv) which tasks and sub-tasks are supported by the information exchanges between and within functional elements; (v) the characteristics of information exchanges; (vi) the guidelines and principles governing the equipment design, and how these relationships may change over time.

The required human interaction requirements should be identified utilizing the terminology expressed in MIL-HDBK-1908 in accordance with MIL-STD-46855 and MIL-STD-1472. See MIL-HDBK-1908, Definitions of Human Factors Terms, 19 Aug. 1999; MIL -STD-46855, Human Engineering Requirements for Military Systems, Equipment, and Facilities, 24 May 2011; MIL-STD-1472, Human Engineering, 11 Jan. 2012.

The corresponding level of human interaction should not exceed human capabilities resulting in negative physiological and/or physical effects as identified utilizing the taxonomies expressed in NASA/SP-2010-3407 in accordance with MIL-STD-46855 and ANSI/H FES zoo. See NASA/SP-2010-3407, Human Integration Design Handbook (HIDH), 27 Jan. 2010; ANSI/H FES zoo, Human Factors Engineering of Software User Interfaces, August 2008.

To summarize, this framework identifies, defines, and hierarchically organizes the interaction of the functional elements within the unmanned system during all modes of operational states. Information that enables human perception, comprehension, and decision-making, within all operational and non-operational environments, should be identified in order to support and maintain SA. Additional Information, Intelligence, Mode of Control (I2C), and SA considerations for unmanned systems have been provided in the DoD Unmanned Systems Safety Guide. See U.S. DoD OUSD Acquisition, Technology and Logistics (AT&L) Systems and Software Engineering/Developmental Test and Evaluation (OUSD (AT&L) SSE/DTE), *Unmanned Systems Safety Guide for DoD Acquisition*, January 2007.

2.2 Unmanned System Safety (USS) Analysis

Unmanned System Safety (USS) analysis for USVs is a baseline process developed to identify the unmanned mission system and the unmanned system architecture safety risk(s). This analysis is conducted in accordance with the safety precepts identified in the DoD Unmanned Systems Safety Guide and MIL-STD-882. See U.S. DoD OUSD Acquisition, Technology and Logistics (AT&L) Systems and Software Engineering/Developmental Test and Evaluation (OUSD (AT&L) SSE/DTE), *Unmanned Systems Safety Guide for DoD Acquisition*, January 2007; MIL-STD-882, Standard Practice for System Safety, 11 May 2012.

Initially, the USS analytical process is aimed at identifying hazards, failure modes, causes, severity and probability of occurrence, hazard control requirements, and identifying and quantifying any residual risk prior to employing the unmanned system. The USS should be executed using the taxonomies identified in the DoD Joint Software Systems Safety Engineering Handbook, 27 Aug. 2010; MIL-STD-1388-1; and, MIL-STD -882. FIG. 9 sets forth some general requirements and initial guidelines for USS analysis in accordance with the present invention. These requirements and guidelines aid the inventive practitioner in achieving a reasonable level of assurance that the unmanned system will execute appropriate functions, within the US architecture, with an acceptable level of safety risk. See, esp., DoD Joint Software Systems Safety Engineering Handbook, 27 Aug. 2010.

2.2.1 General Safety and Risk Assessment

According to typical inventive practice, when conducting a USS analysis it is usually preferred that the analyses listed Task Section zoo of MIL-STD-882 be implemented. These analyses may also be required by a particular unmanned system acquisition program. See DoD Standard Practice, System Safety, MIL-STD-882, 11 May 2012.

2.2.2 Unmanned System Architecture Hazard Analysis

The unmanned system architecture hazard analysis process identifies: (i) potential mishaps and hazards; (ii) specific contributions of the unmanned system architecture that cause, influence, or contribute to the mishap or hazard occurrence; and, (iii) specific points of failure. Examples of typical safety concerns and mishaps are provided in the DoD Unmanned Systems Safety Guide.

The unmanned system architecture hazard analysis is conducted for unmanned systems to assess the required level of automation, command and control authority, or safety information display attributes within the overall unmanned system architecture. The unmanned system architecture hazard analysis should do the following: (i) identify hazards; (ii) define mechanisms to reduce the likelihood of occurrence; (iii) define the requirements for failure detection, annunciation, tolerance, and recovery; (iv) identify the unmanned system actions during failure modes of operation.

Detailed analysis guidelines have been provided in the DoD Joint Software Systems Safety Engineering Handbook. Results should be presented and organized based on the severity and probability of occurrence within the unmanned system architecture typically expressed using a Risk Assessment Code (RAC). See MIL-STD-882, Standard Practice for System Safety, 11 May 2012. This matrix allows for the prioritization of unmanned system hazards identified in terms of severity and probability within unmanned system architecture. Furthermore, the results within the matrix should be weighted accordingly for unmanned systems, utilizing the results from the remainder of USS analyses conducted.

The present inventor is developing a process to identify automatic unmanned system actions that initiated in response to failure occurrences. The process includes in the functional allocation analysis (Step One), and follows, refines, and amplifies the unmanned system architecture hazard analysis (represented by box 2.2.2 in FIG. 4B).

Unmanned systems require rigorous analysis at all stages of development, to ensure safe operations. According to some embodiments of the present invention, "failsafes" are incorporated into the inventive design process through techniques used to respond to operational hazards.

A "failsafe" design should prevent potential mishap occurrence by mitigating the potential risks associated with a failure occurrence. Failsafes are predetermined sequences of automatic actions that are activated upon system malfunction or failure, without human intervention. This onset of actions should result in safe operational conditions that are within acceptable risk limits to personnel and equipment as defined in DoD Instruction 5000.02, Operation of the Defense Acquisition System, 8 Dec. 2012. Failsafes can be used, for instance, to slow an unmanned system to a safe operating speed, or to otherwise direct the unmanned system to a safe predetermined location or safe state.

Without the proper precautions in place, an unmanned system experiencing a fault or failure might cause serious injuries to both military personnel and civilians within the operating area. Tree levels of unmanned system safety precepts have been established by the Unmanned Systems Safety Guide for DoD Acquisition, viz.: Programmatic Safety Precepts (PSPs)—Life-cycle management; Operational Safety Precepts (OSPs)—Operational safety; and, Design Safety Precepts (DSPs)—General unmanned system design. Failsafes should be developed and integrated throughout USV life-cycle in accordance with MIL-STD-882E, DoD Standard Practice for System Safety, 11 May 2012.

Prior to employment of an unmanned system, risks associated with the unmanned system-related hazards should be documented and accepted by the appropriate authority as defined in DoDI 5000.02. MIL-STD-882E defines a "hazard" as "a real or potential condition that could lead to an unplanned event or series of events (i.e. mishap) resulting in death, injury, occupational illness, damage to or loss of equipment or property, or damage to the environment." Hazards should be identified and documented throughout the unmanned system life cycle.

Pursuant to Unmanned Systems Safety Guide for DoD Acquisition, the following Safety-critical Top Level Mishaps (TLM) for unmanned systems should be assessed and documented, as applicable: unintended/abnormal system mobility operation; inadvertent firing or release of weapons; engagement/firing upon unintended targets; self -damage of own system from weapon fire/release; personnel injury; equipment damage; environmental damage; vehicle loss; vehicle collision. For each hazard that is identified, all possible causes, effects, and severities of potential mishaps should be documented in accordance with MIL-STD-882E.

The USS is conducted for each mission mode of operation, and the results should be used to guide the emerging unmanned system design with respect to the imposed safety requirements and the unmanned system safety precepts. See Human -Robot Interaction Function Allocation Analysis (HRI-FAA) Process: Unmanned Surface Vehicle (USV), NSWCCD-23-TM-2012/09. The USS should identify hazards by considering the potential contribution to unmanned system mishaps from: (i) mission mode of operation (task requirements, operating procedures, system limitations, human limitations, environmental impacts, human interaction, event-unique hazards); (ii) system architecture interfaces and controls; and, (iii) inadvertent activation.

Events leading to a potential mishap can result from acts of commission or omission during unmanned system design, development, and operation. Therefore, mishaps can result from either a single point of failure or a sequence of hazardous events. The level of risk associated with causeeffect sequences should be estimated independently as well as in multiple combinations resulting in a mishap occurrence.

When evaluating the risk associated with a unmanned system mishap, the severity and probability of occurrence should be documented for each hazard across all mission modes of operation. Risks are typically expressed as a Risk Assessment Code (RAC), and each is treated slightly differently. According to MIL-STD-882E, RACs are divided into four risk level categories, viz., High, Serious, Medium, and Low. The RAC should prioritize failsafe development.

A systematic risk evaluation should be conducted to ensure that all safety-critical failures resulting in a mishap are addressed. A resultant failure should also be decomposed in terms of recovery actions necessary. Additional safety modifications should be made to the unmanned system architecture based on the prioritized residual risk. This level of risk is determined using a risk priority number (RPN) technique. See Human-Robot Interaction Function Allocation Analysis (HRI-FAA) Process: Unmanned Surface Vehicle (USV), NSWCCD-23-TM-2012/09.

The following is an initial list of safety-critical functions that should be considered: (i) loss of communications (This could be the result of the unmanned system or the host platform location); (ii) loss of control (The unmanned system fails to respond to commands); (iii) loss of situational awareness (SA) (The USV operator is unable to determine the condition, location, or operation of the unmanned system); (iv) loss of capability (The unmanned system cannot fully function); and (v) occurrence of casualty (Major casualties such as fire, flooding, and possible battle damage; minor casualties such as grounding or snag of any towed equipment).

It is also important to consider safety considerations associated with tactical and human elements during unmanned system operations, and the different situations the unmanned system might encounter.

The unmanned system should have the capability to detect and identify a failure or malfunction and automatically invoke the proper sequence of actions. Therefore, additional sensors may need to be installed on the unmanned system in order to verify if everything is functioning properly.

Default unmanned system failure mode operations should be determined for system, sub-system, equipment, and component-level failures or malfunctions that are safety-critical. Careful consideration should be given to the default response to ensure that sequence of actions do not cause more damage or harm by the failure mode. Otherwise expressed, the cure should not be worse than the disease.

An initial list of action categories that may be integrated within the unmanned system failure mode operations include: (i) Terminal; (ii) Conditional; and, (iii) Limited Operation.

A "Terminal" action results in the complete shutting down of the unmanned system. All systems are powered down. This would normally occur in response to a loss-of-control-type failure during transit, or a failure that carries significant consequences. Consideration should be given to the ability for a tracking system, e.g., an Automatic Identification System (AIS), to continue to run so as to be capable of finding the unmanned system.

A "Conditional" action results in the suspension of the mode of operation. The unmanned system reverts to a safe condition by which it may still have limited operations until further assessment can be accomplished. For instance, if there is a loss of communications, the unmanned system may continue to be powered up and proceed for some period of time waiting for the re-establishment of communication orders. Then, if time expires before the re-establishment of communications, the system may then execute some other pre-determined function(s) rendering the system in a safe state.

A "Limited Operation" action results in a partial loss of capability, but still allows continuation of the mission. After the unmanned system loses part of its capability, action is taken by the unmanned system to ensure no further damage is done, and the mission still continues. For example, if the engine or battery were to overheat, the unmanned system would reduce speed or an engine would be shut down; thus, the mission could still be accomplished, albeit at a slower rate.

Regardless of the type of failure mode executed, the unmanned system operator should be able to detect and identify when an action has been invoked. There should be positive confirmation required that the operator has acknowledged the execution of the failsafe and provide information as to what the unmanned system did and what caused it. Therefore, additional unmanned system monitoring sensors may need to be installed on the unmanned system. In order to maintain situational awareness (SA), notifications should be integrated into the HRI C4 design configuration. See Human-Robot Interaction Function Allocation Analysis (HRI-FAA) Process: Unmanned Surface Vehicle (USV), NSWCCD-23-TM-2012/09.

The unmanned system should be designed to enact a failsafe to eliminate or mitigate risk when the onset of problem (e.g., component failure or software glitch) cannot be determined. Based on this principle, the failsafe does not represent another step toward a solution, but rather represents the last step toward a solution—in other words, a risk protection that is residual or last-resort in nature. Thus, a failsafe is usually put into place as a "when-all-else-fails" solution.

Nevertheless, additional safety measures should be provided to mitigate the operational risks associated with unmanned systems, such as warning signage, procedural checklists, and additional training. When the operational risks are not adequately mitigated, the unmanned system design should be reassessed for safety purposes.

Unmanned system safety verification and validation processes should be conducted throughout the unmanned system design and development process. Hazard analyses should be conducted in order to assess the overall safety of the unmanned system employment. Safety verifications and validations should be conducted independently, as well as in combination with the onset of multiple failures to assess the safety unmanned system employment. The effectiveness of each failsafe and failure mode should be verified and validated for each mission mode of operation through appropriate analysis, testing, demonstration, and inspection. Unmanned system safety verification and validation processes should be documented in accordance with MIL-STD-882E, DoD Standard Practice for System Safety, 11 May 2012. Failures during unmanned system operations should result in safe operational conditions that are within acceptable risk limits to personnel and equipment as defined in Do D Instruction 5000.2, Operation of the Defense Acquisition System, 8 Dec. 2012.

Step Three: HRI Automation Allocation

Step Three decomposes and evaluates the automation allocation of unmanned system capabilities in order to optimize HRI configurations within each mode of operation. An overview of Step Three is provided herein in FIGS. 6, 6A, 6B, and 6C.

3.1 Identify the Unmanned System Capabilities

Unmanned system capabilities and limitations should be identified for all modes of operation. The hierarchy of unmanned system capabilities generated should take into account all functional interactions within the unmanned system architecture, resulting in operational and non-operational parameters. These parameters should then be decomposed into a taxonomy based on the current state within each mission mode of operation. This taxonomy is used to determine appropriate levels of autonomy that support effective HRI.

3.2 Identify Unmanned System Mission Safety Considerations

The results from the USS analysis are integrated into the unmanned system mission configuration development. Next, functional limitations within the unmanned system architecture are incorporated for each state within the mission modes of operation. The Risk Assessment Code (RAC) is then utilized to determine the hazards associated with the interaction of the functional elements within the unmanned system capabilities. The potential hazards and safety precepts, along with additional factors such as mission complexity and environmental difficulty, are used to determine the levels of unmanned system autonomy.

3.3 Identify HRI Configuration

Effective configurations are established by determining appropriate levels of autonomy for each unmanned system capability in order to support safe operations. HRI configurations are developed based on the unmanned system modes of operation.

First, the unmanned system capability-based mission performance objectives and functional requirements needed are recalled for each mode of operation. The operational and non-operational parameters should be incorporated within the state of the mode of operation. Based on the synthesis of information for each mode of operation, unmanned system safety precautions, as generated in the USS analysis, should be integrated and adhere to the safety precepts as identified in the DoD Unmanned Systems Safety Guide and MIL-STD-882. All configurations established should allow for safe and efficient switching between states within each mode of operation. Thus, mode awareness and system monitoring information should be identified and integrated into HRI C4 design configuration (FIG. 6B, box 3.3.1.3.1).

The level of control is next defined in the HRI configuration development. Level of control is the authority granted to an entity (i.e., operator) to exercise a command to the unmanned system, its subsystems and/or subordinate systems to accomplish a given mission or task within a mode of operation. In order to execute a command, the required equipment and user interface component should be easily accessible within the HRI C4 design configuration (FIG. 6B, box 3.3.2.2.1).

Based on the control configuration developed, the level of autonomous ability and required human interaction are determined for each mission system capability. The level of autonomy can be variable within a capability based on the abilities available. FIG. 7 sets forth the levels of abilities. The resulting method of control for each unmanned system capability is identified and integrated within the HRI C4 design configuration (FIG. 6B, box 3.3.3.2.1).

FIG. 7 provides descriptions for the present invention's HRI configuration process. See Autonomy Levels for Unmanned Systems (ALFUS) Framework, Volume II: Framework Models Version 1.0, NIST Special Publication 1011-11-1.0, Huang, H. et al., Ed., National Institute of Standards and Technology, Gaithersburg, Md., December 2007. In order to assess the suitability of each USV HRI configuration; the HRI Performance Test and Evaluation (T&E) Plan should be provided at this point.

The framework of H. Huang et al. (NIST Special Publication 1011-11-1.0) classifies robotic autonomy into levels, and identifies considerations that should be taken into account based on the operational environment in terms of sensing and processing capabilities. Huang et al.'s framework represents a standard for permitting practitioners to communicate on operational and developmental issues, analyze mission requirements, and evaluate capabilities of unmanned systems.

As distinguished from the present invention, Huang et al.'s framework does not provide a methodology for decomposing and analyzing an entire system to effectively allocate, in functional respects, the unmanned system capabilities. The "ALFUS" terminology of Huang et al. is incorporated in the present invention's HRI-FAA process. Also incorporated in the present invention's HRI-FAA process are various concepts described by MIL-STDs, MIL-HDBKs, and governing instructions and documents, which can be implemented to support the integration of unmanned systems developed and configured in accordance with the present invention's HRI-FAA process.

To develop effective configurations, typical inventive practice intends that the establishment of the proper HRI be an iterative process. Therefore, if the HRI configuration, at a minimum, does not meet the established unmanned system mission performance requirements or does not support safe and efficient operations, the degraded capability should be functionally reallocated to some degree. This functional reallocation process should take place until requirements and objectives have been met.

Figure 6:
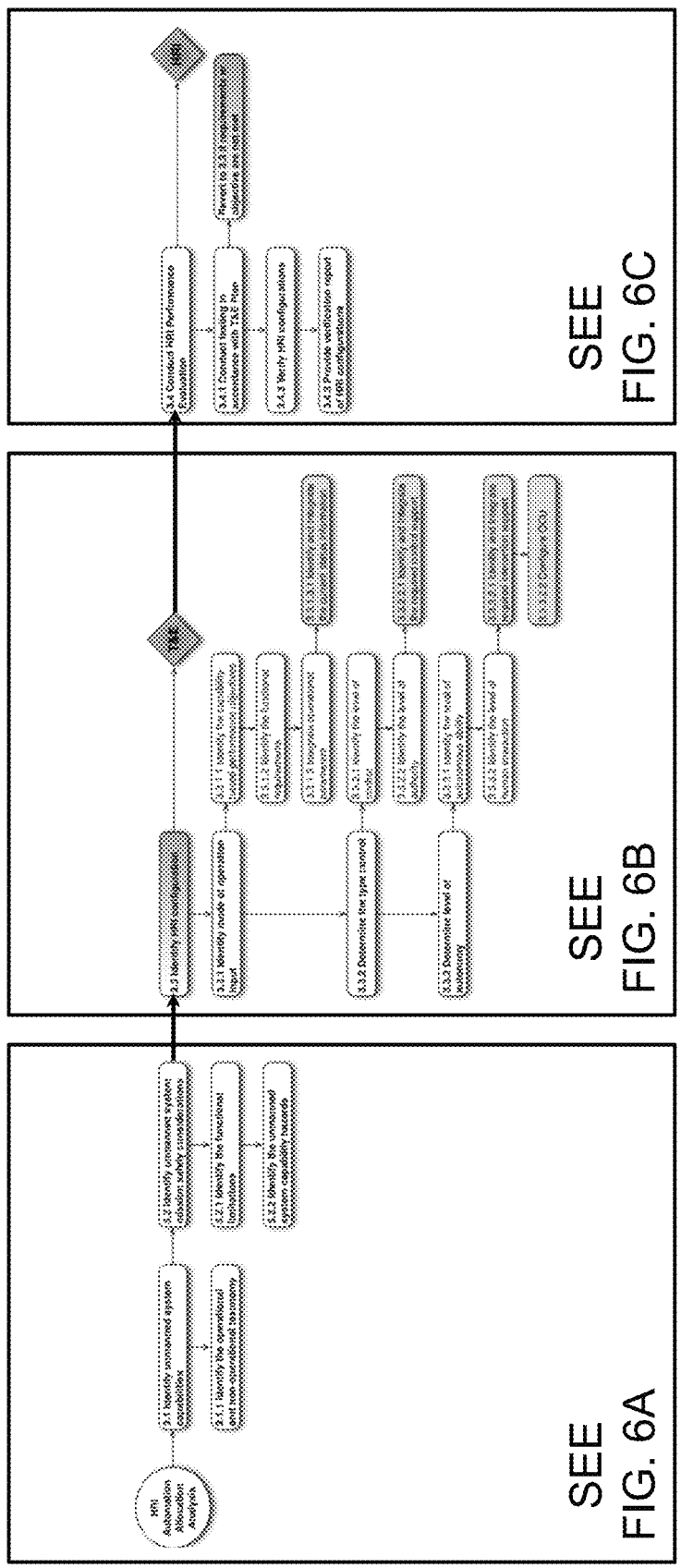
FIG. 6 is a flow diagram illustrating an overview of an HRI Automation Allocation Process in accordance with typical practice of the present invention.
Figure 6A:
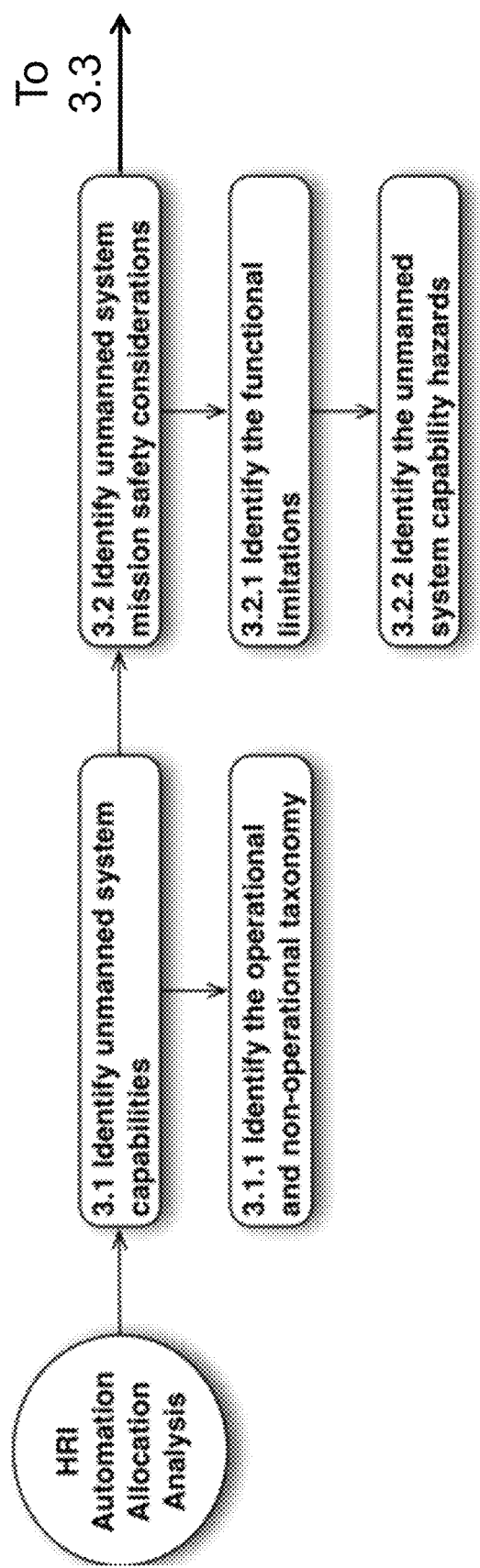
FIGS. 6A, 6B, and 6C are enlarged portions of FIG. 6, together representing the entire FIG. 6.
Figure 6B:
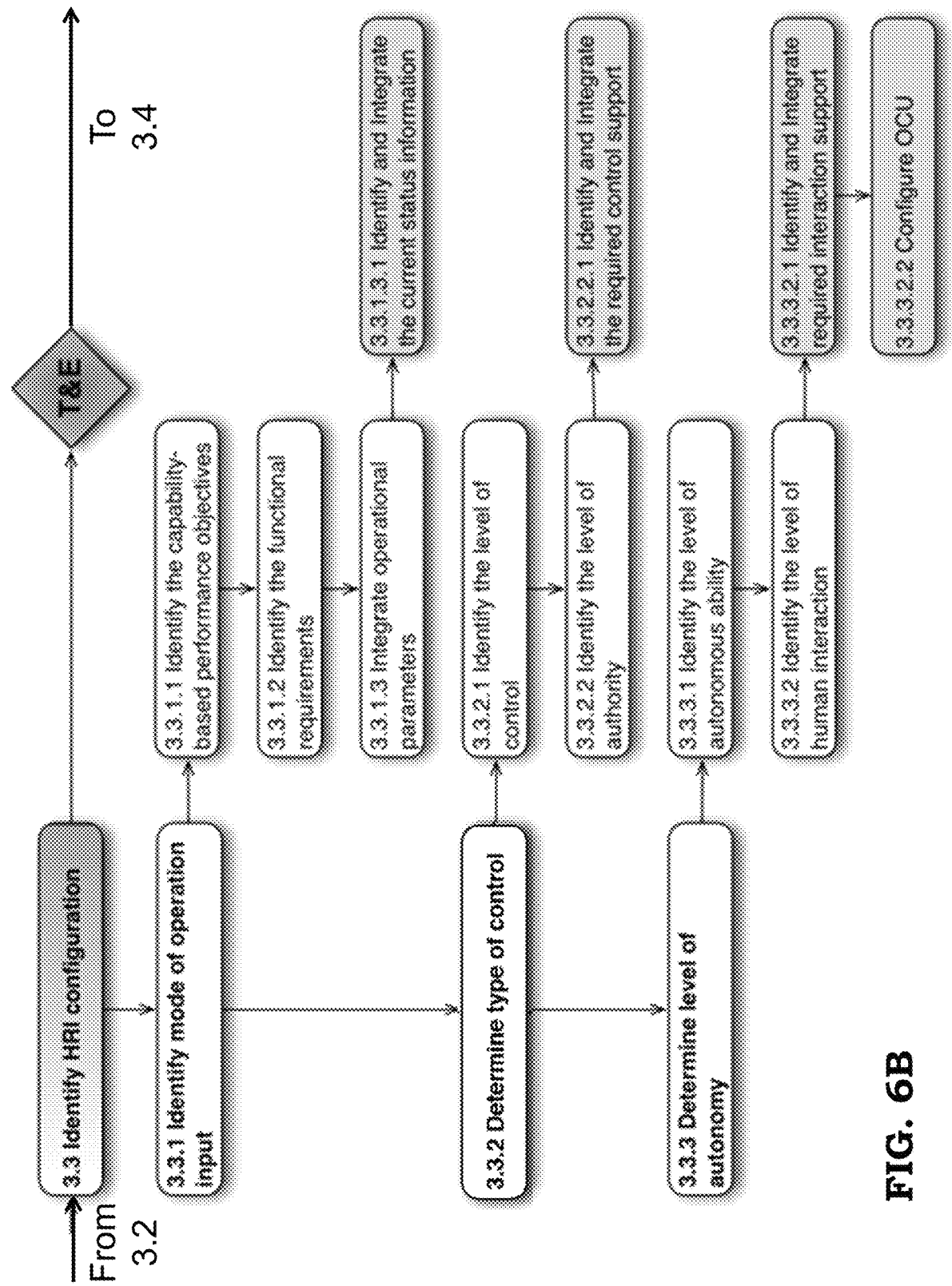
Figure 6C:
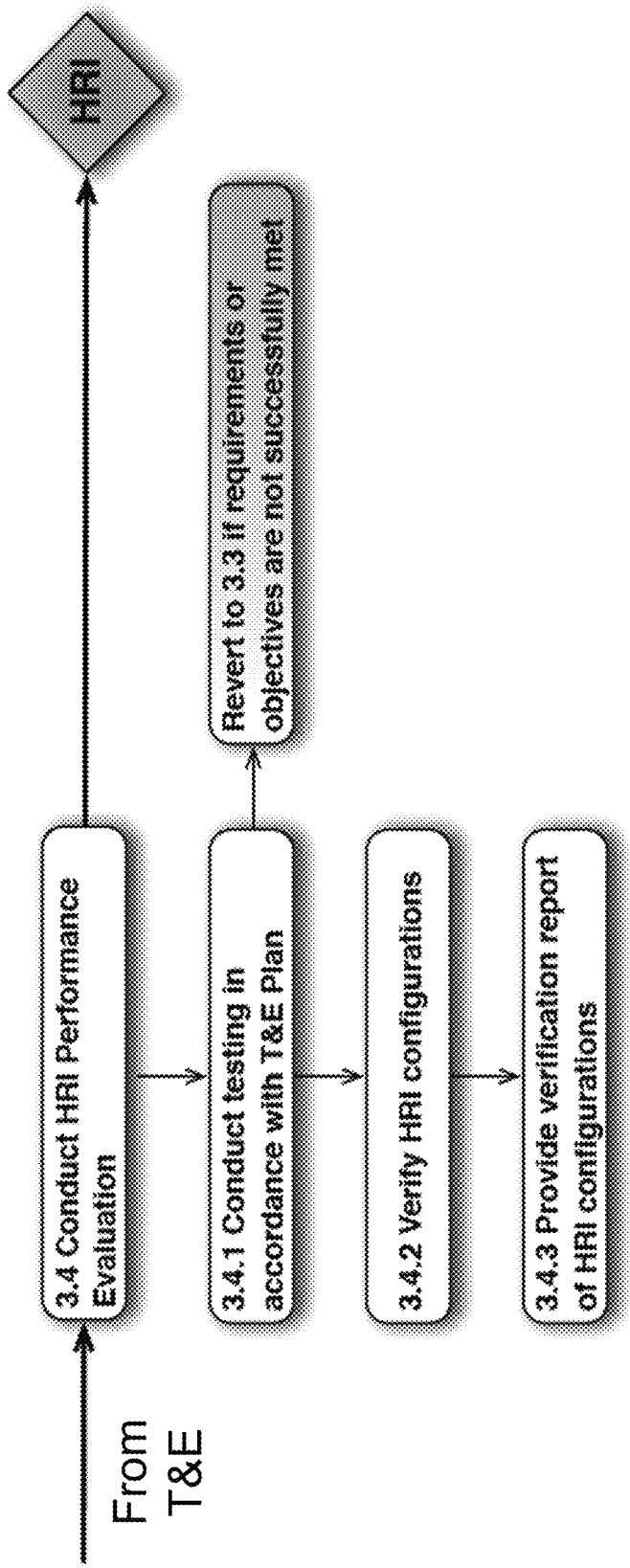

Based on the finalized unmanned system HRI configurations, required input, output, and feedback should be identified and integrated into the operator control unit (OCU) design utilizing the taxonomies identified in MIL-STD-46855 and MIL-STD-1472 (FIG. 6A, box 3.3.3.2.2).

3.4 Conduct HRI Performance Evaluation

HRI evaluations should be conducted to assess the unmanned system performance against the established mission objectives. Prior to HRI evaluation, test plans and procedures should be developed in reference to MIL-STD-1345. See MIL-STD-1345, Preparation of Test Requirements Document, 10 Feb. 1981.

Testing should be tailored to assess the following unmanned system requirements: (i) mission system performance and non-performance; (ii) functional performance; and, (iii) human performance and non-performance. If the unmanned system does not meet the established performance requirements, the HRI configuration(s) should be modified by functionally reallocating the capability, to some degree, based on the evaluation results. The HRI configurations should be evaluated until the unmanned system performance has been successfully verified against the requirements and appropriate standards. Test report documentation should be formatted utilizing MIL-HDBK-831. See MIL-HDBK-831, Preparation of Test Reports, 23 Aug. 1999. The HRI Performance Test and Evaluation (T&E) Plan (including HRI performance evaluation test sub-reports) should be integrated within the HRI Configuration Final Report.

The Intelligent Systems Division of NIST is conducting an ongoing project, sponsored by the Department of Homeland Security Science and Technology Directorate and the National Institute of Justice, to produce a comprehensive set of standard test methods and associated performance metrics to address user requirements for robot mobility, manipulation, sensors, energy, communications, human-robot interfaces, logistics and safety for remotely operated ground vehicles, aquatic vehicles, and micro/mini aerial vehicles (under 2 kg/5 lbs).

Reports

Figure 13:
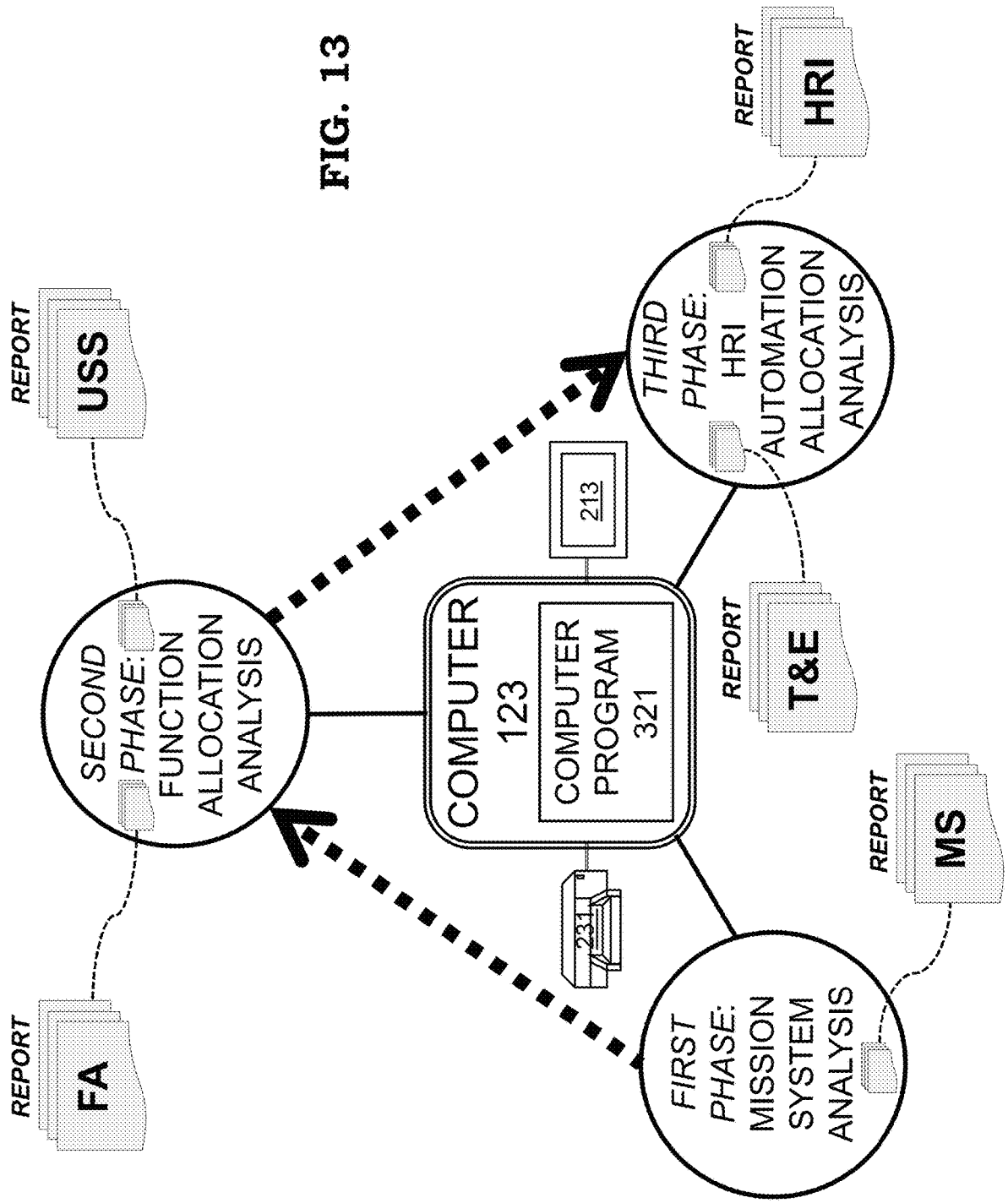
FIG. 13 is a schematic illustrating computer implementation of the three phases (or steps or stages) in accordance with typical practice of the present invention, particularly illustrating phase sequence and report generation in the present invention's process.

Now referring to FIGS. 12, 13, and 14, typical inventive practice provides for generation of five reports, viz.: (i) a Mission System (MS) Report; (ii) a Functional Allocation (FA) Report; (iii) an Unmanned System Safety (USS) Report; (iv) an HRI Performance Test and Evaluation (T&E) Plan; and, (v) an HRI Configuration Final Report. As tabularly represented in FIGS. 11 and 12, each report is characterized by three main components, viz., (i) Purpose, (ii) Application, and (iii) Content.

According to typical inventive practice a computer 123, which has a processor and a memory, has resident in its memory a computer program 321 that accepts, compiles, and organizes data that is continually or periodically input by the practitioner(s) over the course of the HRI-FAA process. During each of the three main steps—viz., I Mission System Analysis, II Function Allocation Analysis, and III HRI Automation Allocation Analysis—data is input into the informational categories and sub -categories in accordance with the corresponding flowchart. That is, the input data for Mission System Analysis comports with the flowchart boxes of FIG. 1; the input data for Function Allocation Analysis comports with the flowchart boxes of FIG. 4; and, the input data for HRI Automation Allocation Analysis Mission System Analysis comports with the flowchart boxes of FIG. 6.

The two principal processing functions of program 321 are: (a) data entry; and, (b) report generation. In an orderly and intelligible fashion, computer 123 (via computer program 321) permits inputting of data and maintains the input data in at least one database, in comportment with the corresponding steps of FIGS. 1, 4, and 6. Further, computer 123 (via computer program 321) processes the database so as to generate five reports, each presented in terms of purpose, application, and content in comportment with FIGS. 11 and 12. Typical inventive practice also implements computer peripherals including a display 213 and a printer 231.

In effecting the first processing function, the inventive software 321 can provide for user insertions of information contextualized in an established questionnaire, whereby the user inputs data in corresponding locations (e.g., blank spaces) on the computer screen 213. The inputting of data can involve, for instance, the entry of answers to straightforward questions set by the inventive software 321. The computer program 321 should be constructed to permit explaining and elaborating as succinctly or extensively as desired by the practitioner, and should provide for entry not only of textual information but also graphical information.

At some point, when the practitioner adjudges that data is sufficiently complete for presentation of a given report, the practitioner activates the second processing function so as to generate the report. According to preferred embodiments, the report reorganizes and assimilates the input data into a standardized report framework established by the inventive software. Computer 123 permits the user to change (e.g., add, modify, or delete) text or graphics in the computer-generated report, thereby perfecting the "raw" report into a finished product that is suitable for release or distribution.

The release/distribution of a report to one or more other persons can be accomplished by hard copy conveyance and/or electronic copy conveyance. The communication of a report to another or others can be accomplished, for instance, via paper correspondence, facsimile transmission, internet, intranet, and/or electronic mail. Various electronic (e.g., digital) storage media can be used for containing the reports, such as network server, hard drive, flash drive, compact disk, and/or floppy disk.

The HRI-FAA methodology of the present invention prescribes the development, configuration, and safe utilization of new or modified unmanned systems. The present invention's novel three-step process determines the appropriate levels of autonomy that facilitate safe and effective operations. Drawing from some known analytical techniques, inventive practice evaluates and optimizes unmanned system HRI configurations, maximizing the capabilities of the unmanned system while accounting for overall limitations. The present invention is applicable to all unmanned systems within various environmental domains, including but not limited to marine, air, and ground.

Pertinent references not noted hereinabove include the following: ANSI/RIA/ISO 10218-1 Robots for Industrial Environment—Safety Requirements—Part 1—Robot; ISO 10218-2 Robots and robotic devices—Safety requirements for industrial robots—Part 2: Robot systems and integration; ISO/RIA TS 15066 Robots and robotic devices—Collaborative Robots; DoD Instruction 5000.02, Operation of the Defense Acquisition System, 8 Dec. 2008; MIL-HDBK-46855, Human Engineering Guidelines for Military Systems, Equipment, and Facilities, 31 Jan. 1996; MIL-HDBK-759, Human Engineering Design Guidelines, 31 Jul. 1995; Bowles, J. & Bonnell, R., (1994) Failure Mode Effects and Criticality Analysis, Annual Reliability and Maintainability Symposium, 1-34.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A method for evaluating the performance of an unmanned vehicle in an unmanned vehicle system, the method comprising:
   identifying plural modes of operation of an unmanned vehicle system, said plural modes of operation including pre-launch, launch, transit, mission, recovery, and post-recovery;
   identifying plural capability-based performance objectives relating to said plural modes of operation of said unmanned vehicle system;

identifying plural functional requirements relating to said plural modes of operation of said unmanned vehicle system;

identifying plural levels of autonomy characterizing an unmanned vehicle, wherein said plural levels of autonomy include remote control, tele-operation, human directed, human aided, and autonomous;

providing a first said unmanned vehicle, the first said unmanned vehicle characterized by a first said level of autonomy;

providing a second said unmanned vehicle. the second said unmanned vehicle characterized by a second said level of autonomy, the second said level of autonomy differing from the first said level of autonomy;

obtaining a first set of empirical data, said first set of empirical data associated with a first embodiment of said unmanned vehicle system and pertaining to said plural modes of operation of said mission first embodiment of said unmanned vehicle system, said first embodiment of said unmanned vehicle system including the first said unmanned vehicle, said obtaining of said first set of empirical data including conducting testing of said first embodiment of said unmanned vehicle system, said testing of said first embodiment of said unmanned vehicle system including operating the first said unmanned vehicle in each of said plural modes of operation of said first embodiment of said unmanned vehicle system;

obtaining a second set of empirical data. said second set of empirical data associated with a second embodiment of said mission unmanned vehicle system and pertaining to said plural modes of operation of said second embodiment of said unmanned vehicle system, Said second embodiment of said unmanned vehicle system including the second said unmanned vehicle, said obtaining of said second set of empirical data including conducting testing of said second embodiment of said unmanned vehicle mission system. said testing of said second embodiment of said unmanned vehicle system including operating the second said unmanned vehicle in each of said plural modes of operation of said second embodiment of said unmanned vehicle system;

analyzing said first set of empirical data;

analyzing said second set of empirical data;

wherein if, in accordance with said analyzing of said first set of empirical data and said analyzing of said second set of empirical data, said plural capability-based performance objectives and said plural functional requirements are not met by at least one of said first embodiment of said unmanned vehicle system and said second embodiment of said unmanned vehicle system, then the method for evaluating the performance of an unmanned vehicle in an unmanned vehicle system further comprises repeating, at least once:

said providing of the first said unmanned vehicle;
said providing of the second said unmanned vehicle;
said obtaining of said first set of empirical data;
said obtaining of said second set of empirical data;
said analyzing of said first set of empirical data;
said analyzing of said second set of empirical data.

2. The method for evaluating the performance of an unmanned vehicle in an unmanned vehicle system as recited in claim 1 wherein:

said providing of the first said unmanned vehicle includes equipping the first said unmanned vehicle with the first said level of autonomy;

said providing of the second said unmanned vehicle includes equipping the second said unmanned vehicle with the second said level of autonomy.

3. The method for evaluating the performance of an unmanned vehicle in an unmanned vehicle system as recited in claim 1 wherein the method further comprises:

analyzing a mission system, said mission system characterized by human-robot interaction wherein said robot is an unmanned vehicle, said analyzing of said mission system including identifying the needs of said mission system, identifying mission system integration parameters, identifying mission capability configuration, and creating a mission system report based at least in part on said identifying of the needs of said mission system, said identifying of mission system integration parameters, and said identifying of mission capability configuration;

analyzing function allocation, said analyzing of function allocation including analyzing mission activity, creating a functional allocation report based at least in part on said analyzing of mission activity, analyzing unmanned system safety, and creating an unmanned system safety report based at least in part on said analyzing of unmanned system safety; and analyzing human-robot interaction automation allocation, said analyzing of human -robot interaction automation allocation including identifying unmanned system capabilities, identifying unmanned system mission safety considerations, identifying human-robot interaction configuration, creating a human-robot interaction test and evaluation plan based at least in part on said identifying of unmanned system capabilities and said identifying of unmanned system mission safety considerations and said identifying of human-robot interaction configuration, conducting a human-robot interaction performance evaluation in accordance with said human-robot interaction test and evaluation plan, and creating a human-robot interaction configuration final report based at least in part on said conducting of a human-robot interaction performance evaluation.

4. The method for evaluating the performance of an unmanned vehicle in an unmanned vehicle system as recited in claim 3 wherein:

said creation of said functional allocation report is based in part on said mission system report;

said creation of said unmanned system safety report is based in part on said mission system report and said functional allocation report;

said creation of said human-robot interaction test and evaluation plan is based in part on said mission system report, and said functional allocation report, and said unmanned system safety report;

said creation of said human-robot interaction configuration final report is based in part on said mission system report, said functional allocation report, said unmanned system safety report, and said human-robot interaction test and evaluation plan.

5. The method for evaluating the performance of an unmanned vehicle in an unmanned vehicle system as recited in claim 3 wherein said creation of said mission system report, said creation of said functional allocation report, said creation of said unmanned system safety report, said creation of said human-robot interaction test and evaluation plan, and said creation of said human-robot interaction configuration final report each include embodiment in either hard copy form, or electronic form, or both hard copy form and electronic form.

6. The method for evaluating the performance of an unmanned vehicle in an unmanned vehicle system as recited in claim 3 wherein:
  said analysis of said mission system, said analysis of function allocation, and said analysis of human-robot interaction automation allocation are each performed using a computer;
  said computer accepts inputting of data pertaining to said analysis of said mission system, said analysis of function allocation, and said analysis of human-robot interaction automation allocation;
  said computer generates said mission system report, said functional allocation report, said unmanned system safety report, said human-robot interaction test and evaluation plan, and said human-robot interaction configuration final report.

7. The method for evaluating the performance of an unmanned vehicle in an unmanned vehicle system as recited in claim 6 wherein:
  said creation of said functional allocation report is based in part on said mission system report;
  said creation of said unmanned system safety report is based in part on said mission system report and said functional allocation report;
  said creation of said human-robot interaction test and evaluation plan is based in part on said mission system report, and said functional allocation report, and said unmanned system safety report;
  said creation of said human-robot interaction configuration final report is based in part on said mission system report, said functional allocation report, said unmanned system safety report, and said human-robot interaction test and evaluation plan.

8. The method for evaluating the performance of an unmanned vehicle in an unmanned vehicle system as recited in claim 6 wherein:
  said creation of said mission system report includes digitally representing said mission system report;
  said creation of said functional allocation report includes digitally representing said functional allocation report;
  said creation of said unmanned system safety report includes digitally representing said unmanned system safety report;
  said creation of said human-robot interaction test and evaluation plan includes digitally representing said human-robot interaction test and evaluation plan;
  said creation of said human-robot interaction configuration final report includes digitally representing said human-robot interaction configuration final report.

9. The method for evaluating the performance of an unmanned vehicle in an unmanned vehicle system as recited in claim 6 further comprising conveying, to at least one person, each of said mission system report, said functional allocation report, said unmanned system safety report, said human -robot interaction test and evaluation plan, and said human-robot interaction configuration final report, each said conveyance being effected by either hard copy communication, or electronic communication, or both hard copy communication and electronic communication.

10. The method for evaluating the performance of an unmanned vehicle in an unmanned vehicle system as recited in claim 9 wherein:
  said creation of said functional allocation report is based in part on said mission system report;
  said creation of said unmanned system safety report is based in part on said mission system report and said functional allocation report;
  said creation of said human-robot interaction test and evaluation plan is based in part on said mission system report, and said functional allocation report, and said unmanned system safety report;
  said creation of said human-robot interaction configuration final report is based in part on said mission system report, said functional allocation report, said unmanned system safety report, and said human-robot interaction test and evaluation plan.

11. A method for developing an unmanned vehicle system, said development of said unmanned vehicle system including allocation of functions between human and robot in interaction between said human and said robot, the method comprising conducting a human-robot interaction performance evaluation with respect to at least six modes of operation of said unmanned vehicle system, said at least six modes of operation including pre-launch mode of operation, launch mode of operation, transit mode of operation, mission mode of operation, recovery mode of operation, and post-recovery mode of operating, wherein said conducting of said human-robot interaction performance evaluation includes:
  formulating a test plan for said unmanned vehicle system, wherein said formulating of said test plan includes establishing performance objectives of said unmanned vehicle system and establishing functional requirements of said unmanned vehicle system, wherein said performance objectives and said functional requirements are based on factors including: capabilities of said unmanned vehicle system; safety concerns of said unmanned vehicle system; human-robot interaction configuration of said unmanned vehicle system; needs of said unmanned vehicle system; integration parameters of said unmanned vehicle system; function allocation of said unmanned vehicle system;
  in accordance with the formulated said test plan for said unmanned vehicle system, performing testing of each of at least two embodiments of said unmanned vehicle system with respect to said at least six modes of operation and in consideration of said capability -based performance objectives and said functional requirements, said at least two embodiments of said unmanned vehicle system including a first said embodiment of said unmanned vehicle system and a second said embodiment of said unmanned vehicle system;
  wherein said testing of the first said embodiment of said unmanned vehicle system includes providing and operating a first unmanned vehicle, said providing of said first unmanned vehicle including configuring said first unmanned vehicle so that the first said embodiment of said unmanned vehicle system is characterized by a first level of autonomy, said operating of said first unmanned vehicle being performed with respect to said pre-launch mode of operation, said launch mode of operation, said transit mode of operation, said mission mode of operation, said recovery mode of operation, and said post-recovery mode of operation;
  wherein said testing of the second said embodiment of said unmanned vehicle system includes providing and operating a second unmanned vehicle, said providing of said second unmanned vehicle including configuring said second unmanned vehicle so that the second said embodiment of said unmanned vehicle system is characterized by a Second level of autonomy. said operating of said second unmanned vehicle being performed with respect to said pre-launch mode of operation, said launch mode of operation, said transit mode of operation, said mission mode of operation, said recovery mode of operation. and said post-recovery mode of operation, the second said level of autonomy differing from the first said level of autonomy;

wherein each said level of autonomy is selected from the group consisting of remote control, tele-operation, human directed, human aided, and autonomous;

wherein if at least one of said performance objectives or at least one of said functional requirements is not met by the first said embodiment of said unmanned vehicle system, and at least one of said performance objectives or at least one of said functional requirements is not met by the second said embodiment of said unmanned vehicle system, then said conducting of said human-robot interaction performance evaluation further includes:

formulating anew said test plan for said unmanned vehicle system;

in accordance with the formulated anew said test plan for said unmanned vehicle system, performing anew said testing of each of at least two embodiments of said unmanned vehicle system with respect to said at least six modes of operation and in consideration of said capability-based performance objectives and said functional requirements.

12. The method for developing an unmanned vehicle system as recited in claim 11, wherein said conducting of said human-robot interaction performance evaluation further includes generating a human-robot interaction configuration final report, said human-robot interaction configuration final report being based on at least one said formulation of said test plan for said unmanned vehicle system and on at least one said performance of said testing of said embodiment of said unmanned vehicle system.

13. The method for developing an unmanned vehicle system as recited in claim 12, wherein said generating of a human-robot interaction configuration final report includes implementing a non-transitory computer-readable storage medium comprising computer-executable computer code characterized by computer program logic for enabling a computer to process information relating to said at least one said formulation of said test plan for said unmanned vehicle system and to said at least one said performance of said testing of said embodiment of said unmanned vehicle system.

14. The method for developing an unmanned vehicle system as recited in claim 12, wherein said generating of a human-robot interaction configuration final report includes implementing a computer executing computer code characterized by computer program logic for enabling said computer to process information relating to said at least one said formulation of said test plan for said unmanned vehicle system and to said at least one said performance of said testing of said embodiment of said unmanned vehicle system.

* * * * *